(12) United States Patent
Woo et al.

(10) Patent No.: US 12,161,030 B2
(45) Date of Patent: Dec. 3, 2024

(54) LIGHT EMITTING DISPLAY DEVICE WITH TRANSISTOR IN TRANSPARENT DISPLAY AREA

(71) Applicant: Samsung Display Co., Ltd., Yongin-Si (KR)

(72) Inventors: Min Woo Woo, Seoul (KR); Sung Ho Kim, Suwon-si (KR); Seok Je Seong, Seongnam-si (KR); Jin Sung An, Gwacheon-si (KR); Wang Woo Lee, Osan-si (KR); Ji Seon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 346 days.

(21) Appl. No.: 17/408,534

(22) Filed: Aug. 23, 2021

(65) Prior Publication Data
US 2022/0246710 A1 Aug. 4, 2022

(30) Foreign Application Priority Data

Feb. 1, 2021 (KR) ........................ 10-2021-0014176

(51) Int. Cl.
*H10K 59/131* (2023.01)
*H10K 59/121* (2023.01)
*H10K 59/65* (2023.01)

(52) U.S. Cl.
CPC ....... *H10K 59/131* (2023.02); *H10K 59/1213* (2023.02); *H10K 59/65* (2023.02)

(58) Field of Classification Search
CPC ... H10K 59/131; H10K 59/65; H10K 59/1213
See application file for complete search history.

(56) References Cited

U.S. PATENT DOCUMENTS

| 2014/0034923 | A1* | 2/2014 | Kim .................... H10K 59/123 257/40 |
| 2017/0193876 | A1* | 7/2017 | Choi ..................... G09G 3/2003 |
| 2018/0053032 | A1* | 2/2018 | Ding ................... G06V 40/1318 |
| 2020/0052048 | A1* | 2/2020 | Kuo ....................... G06F 1/1605 |
| 2021/0193758 | A1* | 6/2021 | Choi .................... H10K 59/123 |
| 2021/0193781 | A1* | 6/2021 | Shim ...................... H10K 59/65 |

FOREIGN PATENT DOCUMENTS

| CN | 111785761 A | 10/2020 |
| KR | 10-2020-0089380 A | 7/2020 |
| KR | 10-2021-0055850 A | 5/2021 |

* cited by examiner

*Primary Examiner* — Lex H Malsawma
(74) *Attorney, Agent, or Firm* — Innovation Counsel LLP

(57) ABSTRACT

An embodiment provides a light emitting display device, including a display panel including a display area, wherein the display area of the display panel includes: a transparent display area; an intermediate display area that is disposed at one side or both sides of the transparent display area along a first direction and includes a pixel circuit part for a transparent display area; and a normal display area, and wherein the transparent display area includes: a first anode; and a transmission transistor that transmits an emission current outputted from the pixel circuit part for the transparent display area to the first anode.

20 Claims, 17 Drawing Sheets

LIGHT EMITTING DISPLAY DEVICE WITH TRANSISTOR IN TRANSPARENT DISPLAY AREA

CROSS-REFERENCE TO RELATED APPLICATION

This application claims priority to and the benefit of Korean Patent Application No. 10-2021-0014176 filed in the Korean Intellectual Property Office on Feb. 1, 2021, the entire contents of which are incorporated herein by reference.

BACKGROUND

1. Field

The present disclosure relates to a light emitting display device, and more particularly, to a light emitting display device in which an optical device such as a camera is disposed on a rear surface of a display area.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

Particularly, in a small electronic device such as a mobile phone, an optical device such as a camera and an optical sensor is formed in a bezel area around a display area, but as a size of the display area is increased while a size of a peripheral area of the display area is gradually decreased, a technology in which a camera or an optical sensor may be disposed on a rear surface of the display area is being developed.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a light emitting display device in which, even if an optical device such as a camera or an optical sensor is disposed on a rear surface of a display area, an image may be displayed in the display area disposed on a front surface of the optical device, and resolution of the image displayed on the front surface of the optical device is high.

An embodiment provides a light emitting display device, including a display panel including a display area, wherein the display area of the display panel includes: a transparent display area; an intermediate display area that is disposed at one side or both sides of the transparent display area along a first direction and includes a pixel circuit part for a transparent display area; and a normal display area, and wherein the transparent display area includes a first anode, and a transmission transistor that transmits an emission current outputted from the pixel circuit part for the transparent display area to the first anode.

A wire connecting the transmission transistor in the pixel circuit part for the transparent display area may be a first transparent connection wire including a transparent conductive material.

Each of the transparent connection wires may connect a plurality of the pixel circuit parts for the transparent display area and a plurality of the transmission transistors.

The transparent connection wire may include a first portion, a second portion, and a connection portion interposed between the first portion and the second portion; the first portion may be disposed in the intermediate display area, and is connected to a plurality of the pixel circuit parts for the transparent display area; and the second portion may be disposed in the transparent display area, and is connected to a plurality of the transmission transistors.

The connection portion may extend in the first direction to connect the first portion and the second portion, and the first portion and the second portion may extend in a second direction perpendicular to the first direction.

The first portion, the second portion, and the connection portion may be integrally formed of a same transparent conductive material.

The intermediate display area may include: a pixel circuit part for an intermediate display area; and an anode receiving an emission current of the pixel circuit part for the intermediate display area and disposed in the intermediate display area.

The pixel circuit part for the transparent display area and the pixel circuit part for the intermediate display area of the intermediate display area may have a same structure.

The pixel circuit part for the intermediate display area may include: a driving transistor; and an output control transistor receiving and outputting an emission current of the driving transistor, and wherein a gate electrode of the output control transistor may be connected to an emission control line.

A gate electrode of the transmission transistor may be connected to the emission control line.

The normal display area may include: a pixel circuit part for a normal display area; and an anode receiving an emission current of the pixel circuit part for the normal display area and disposed in the intermediate display area.

The pixel circuit part for the normal display area may include: a driving transistor; and an output control transistor receiving and outputting an emission current of the driving transistor, and wherein a gate electrode of the output control transistor may be connected to an emission control line.

A gate electrode of the transmission transistor may be connected to the emission control line.

The transparent display area may further include a second anode that receives an emission current directly from the pixel circuit part for the transparent display area without passing through the transmission transistor.

The second anode and the pixel circuit part for the transparent display area may be connected by a second transparent connection wire including a transparent conductive material.

The first transparent connection wire may be formed closer to a substrate than the second transparent connection wire.

A second display area that includes the transparent display area and the intermediate display area may further include a copy anode that is electrically connected to the first anode or the second anode.

The first anode or the second anode and the copy anode may be connected by a third transparent connection wire including a transparent conductive material, and the third transparent connection wire may be formed further away from the substrate than the first transparent connection wire and the second transparent connection wire.

The first transparent connection wire may be formed during a process of manufacturing a transistor included in the pixel circuit part for the transparent display area or formed after manufacturing the transistor.

The light emitting display device may further include an optical element disposed on a back surface of the display panel, wherein the transparent display area may overlap the optical element in a plan view.

According to the embodiments, a plurality of light emitting elements and a plurality of transmission transistors (eighth transistors) may be formed in an area in which an optical device such as a camera or an optical sensor is disposed on a rear surface of a display area of a light emitting display device, and an image may be displayed with high resolution even in a front surface of the optical device by connecting the plurality of transmission transistors with a single transparent connection wire. In addition, since a plurality of light emitting elements may be connected through a single transparent connection wire by a plurality of transmission transistors, a pixel per inch (PPI) value of a light emitting display element disposed in a front surface of an optical device is large. As a result, a screen displayed by the light emitting display device according to the present embodiment may display an image with high resolution on the front surface of the optical device, thereby improving display quality.

DETAILED DESCRIPTION

Figure 1:
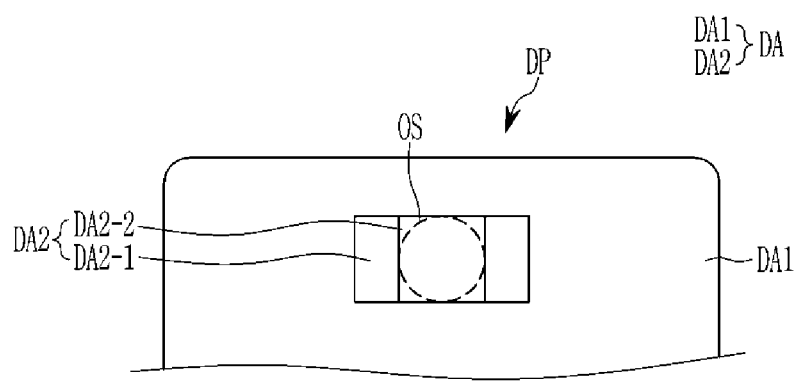
FIG. 1 illustrates an enlarged top plan view of a partial area of a light emitting display device according to an embodiment.

The present disclosure will be described more fully hereinafter with reference to the accompanying drawings, in which embodiments of the disclosure are shown. As those skilled in the art would realize, the described embodiment may be modified in various different ways, all without departing from the spirit or scope of the present.

In order to clearly describe the present disclosure, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

First, hereinafter, a display area of a light emitting display device according to an embodiment will be divided with reference to FIG. 1, and a position of an optical device such as a camera or an optical sensor will be described.

FIG. 1 illustrates an enlarged top plan view of a partial area of a light emitting display device according to an embodiment.

FIG. 1 illustrates a portion of a display panel DP of a display device according to an embodiment, wherein the display panel is for a mobile phone.

A display area DA is disposed in a front surface of the display panel DP, and the display area DA is largely divided into a first display area DA1 and a second display area DA2.

A plurality of light emitting elements, and a plurality of pixel circuits that generate and transmit an emission current to each of the plurality of light emitting elements, are formed in the first display area DA1. Here, one light emitting element and one pixel circuit are referred to as a pixel PX.

One pixel circuit and one light emitting element are formed at a one-to-one ratio in the first display area DA1. The first display area DA1 is hereinafter also referred to as a 'normal display area'.

Although a structure of the display panel DP below a cutting line is not shown in FIG. 1, the first display area DA1 may be positioned below the cutting line.

An optical device OS such as a camera or an optical sensor is disposed on a rear surface of the display panel DP, and in FIG. 1, since the optical device OS is disposed on the rear surface, it is shown as a dotted line.

The second display area DA2 is disposed on a front surface of and around the optical device OS. The second display area DA2 is divided into a (2-1)-th display area DA2-1 and a (2-2)-th display area DA2-2.

The (2-2)-th display area DA2-2 is a display area disposed on the front surface of the optical device OS, and a plurality of light emitting elements are formed therein, but a pixel circuit that generates and transmits an emission current to the light emitting element is not formed therein. Meanwhile, a transmission transistor (hereinafter, also referred to as an eighth transistor) and a transparent connection wire are further formed in the (2-2)-th display area (DA2-2) according to the embodiment. In the (2-2)-th display area DA2-2, an area excluding the area in which the plurality of light emitting elements or the transmission transistor (eighth transistor) are disposed may be transparently formed, and the optical device OS may operate in the transparent area, so that a camera or optical sensor captures or senses an object positioned in front of the display panel DP. In FIG. 1, the (2-2)-th display area DA2-2 is shown as a quadrangular shape. However, the (2-2)-th display area DA2-2 may have a shape corresponding to a planar shape of the optical device OS, such as a circular shape, in some embodiments. Hereinafter, the (2-2)-th display area DA2-2 is also referred to as a 'transparent display area'.

The (2-1)-th display area DA2-1 is disposed at one side or both sides of the (2-2)-th display area DA2-2, and is disposed between the first display area DA1 and the (2-2)-th display area DA2-2. In the (2-1)-th display area DA2-1, one pixel circuit and one light emitting element are formed at a one-to-one ratio, and additionally, a pixel circuit for transmitting an emission current to each of the plurality of light emitting elements formed in the (2-2)-th display area DA2-2 is further included. Hereinafter, the (2-1)-th display area DA2-1 is also referred to as an 'intermediate display area'.

FIG. 1 illustrates the embodiment in which the (2-1)-th display areas DA2-1 are disposed at both left and right sides of the (2-2)-th display area DA2-2, and a left-right width of one (2-1)-th display area DA2-1 may be half of a left-right width of the (2-2)-th display area DA2-2. In addition, the first display area DA1 is disposed in an area in which the (2-1)-th display area DA2-1, as an area adjacent to the (2-2)-th display area DA2-2, is not disposed. A direction in which the (2-1)-th display area DA2-1 is disposed based on the (2-2)-th display area DA2-2 may be the same as an extension direction (first direction) of a wire connected to a gate electrode of the transmission transistor (eighth transistor). In addition, the transparent connection wire formed in the (2-2)-th display area DA2-2 may extend from the (2-1)-th display area DA2-1 to the (2-2)-th display area DA2-2.

Although not shown in FIG. 1, a peripheral area may be further disposed outside the display area DA. In addition, although FIG. 1 illustrates the display panel for the mobile phone, the present embodiment may be applied as long as it is a display panel in which the optical element OS may be disposed on the rear surface of the display panel.

Hereinafter, the structure of the display area DA will be described in more detail with reference to FIG. 2.

Figure 2:
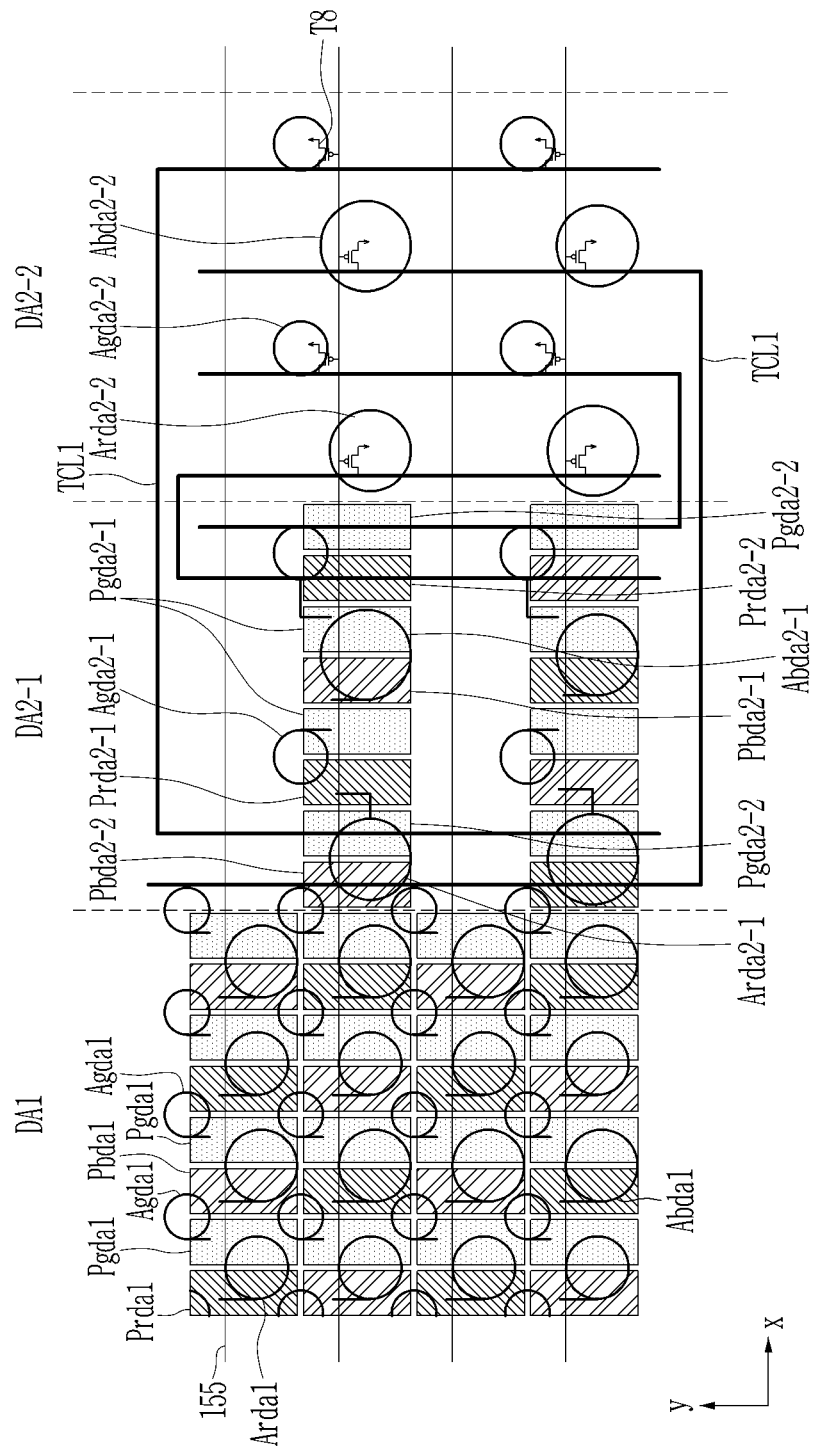
FIG. 2 illustrates an enlarged schematic view of a first display area and a second display area in a light emitting display device according to an embodiment.

FIG. 2 illustrates an enlarged schematic view of a first display area and a second display area in a light emitting display device according to an embodiment.

FIG. 2 illustrates in detail arrangement of the pixel circuit and the light emitting element configuring the pixel PX, and a structure of the transmission transistor (hereinafter also referred to as the eighth transistor) and the transparent connection wire added to the second display area DA2, in the first display area DA1 (normal display area), the (2-1)-th display area DA2-1 (intermediate display area), and the (2-2)-th display area DA2-2 (transparent display area) according to the embodiment.

Firstly, a plurality of light emitting elements and a plurality of pixel circuit parts (Prda1, Pgda1, and Pbda1) (hereinafter, also referred to as pixel circuit parts for the normal display area) that are formed in the same number are formed in the first display area DA1 (normal display area). In FIG. 2, the pixel circuit parts (Prda1, Pgda1, and Pbda1) are simply shown in a rectangular shape, and anodes (Arda1, Agda1, and Abda1) of the light emitting elements are simply shown in a circular shape.

The anode (Arda1, Agda1, and Abda1) may be disposed above the pixel circuit parts (Prda1, Pgda1, and Pbda1) to overlap the pixel circuit parts (Prda1, Pgda1, and Pbda1) in a plan view. In addition, which pixel circuit parts (Prda1, Pgda1, and Pbda1) are connected to the anodes (Arda1, Agda1, and Abda1) is clearly shown, by showing linear connection parts protruding from the circles of the anodes (Arda1, Agda1, and Abda1). The light emitting element further includes an emission layer and a cathode (see FIG. 13) in addition to the anode. A planar shape of the light emitting element may have a shape similar to that of the anode (Arda1, Agda1, and Abda1) excluding the connection part, and in some embodiments, the anode (Arda1, Agda1, and Abda1) excluding the connection part may have various shapes such as a rhombus shape, a hexagonal shape, and an octagonal shape.

In the embodiment of FIG. 2, four pixels are used as a unit pixel and are repeatedly arranged. The four pixels configuring one unit pixel consists of one red pixel, one blue pixel, and two green pixels. However, in some embodiments (for example, an embodiment of FIG. 10), at least one red pixel, at least one green pixel, and at least one blue pixel may be included.

In the embodiment of FIG. 2, positions of the red pixel circuit part Prda1 and the blue pixel circuit part Pbda1 are changed for each row. That is, the red pixel circuit part Prda1 and the blue pixel circuit part Pbda1 are alternatively positioned.

A PPI (Pixel Per Inch) value of the pixel disposed in the second display area DA2 is smaller than a PPI value of the pixel formed in the first display area DA1.

A plurality of pixel circuit parts (Prda2-1, Prda2-2, Pgda2-1, Pgda2-2, Pbda2-1, and Pbda2-2) and a plurality of light emitting elements are disposed in the (2-1)-th display area DA2-1 (intermediate display area), and FIG. 2 illustrates anodes (Arda2-1, Agda2-1, and Abda2-1) of the plurality of light emitting elements. The plurality of pixel circuit parts (Prda2-1, Prda2-2, Pgda2-1, Pgda2-2, Pbda2-1, and Pbda2-2) of the (2-1)-th display area DA2-1 are divided into the pixel circuit parts (Prda2-1, Pgda2-1, and Pbda2-1) (hereinafter, also referred to as the pixel circuit parts for the intermediate display area) for the (2-1)-th display area and the pixel circuit parts (Prda2-2, Pgda2-2, Pbda2-2) (hereinafter, also referred to as the pixel circuit parts for the transparent display area) for the (2-2)-th display area. The pixel circuit parts (Prda2-1, Pgda2-1, and Pbda2-1) for the (2-1)-th display area are pixel circuit parts that transmit an emission current to the anodes (Arda2-1, Agda2-1, and Abda2-1) disposed in the (2-1)-th display area DA2-1 (intermediate display area). Each of the pixel circuit parts (Prda2-1, Pgda2-1, and Pbda2-1) for the (2-1)-th display area and each of the anodes (Arda2-1, Agda2-1, and Abda2-1) disposed in the (2-1)-th display area DA2-1 (intermediate display area) may correspond to each other respectively.

The pixel circuit parts (Prda2-2, Pgda2-2, and Pbda2-2) for the (2-2)-th display area are disposed in the (2-1)-th display area DA2-1 (intermediate display area), however, it generates an emission current to be transmitted to the light emitting element disposed in the (2-2)-th display area DA2-2 (transparent display area).

The pixel circuit parts (Prda2-1, Pgda2-1, and Pbda2-1) for the (2-1)-th display area and the pixel circuit parts (Prda2-2, Pgda2-2, and Pbda2-2) for the (2-2)-th display area have the same planar structure and circuit structure, except for the structure connected to the anodes.

In the embodiment of FIG. 2, four pixel circuit parts (Prda2-1, Pgda2-1, and Pbda2-1) for the (2-1)-th display area are continuously formed, and two pixel circuit parts (Prda2-2, Pgda2-2, and Pbda2-2) for the (2-2)-th display area are disposed at both sides thereof. However, in some embodiments, they may be disposed in various arrangements, and for example (see FIG. 10), the pixel circuit parts (Prda2-1, Pgda2-1, and Pbda2-1) for the (2-1)-th display area and the pixel circuit parts (Prda2-2, Pgda2-2, and Pbda2-2) for the (2-2)-th display area may be alternately arranged one by one.

No pixel circuit part is formed in the (2-2)-th display area DA2-2 (transparent display area), while a plurality of light emitting elements, the transmission transistor T8 (eighth transistor), and wires connected thereto (transparent connection wire TCL1 and an emission control line 155) are formed therein.

In FIG. 2, the anodes (Arda2-2, Agda2-2, and Abda2-2) of the light emitting element, the transmission transistor T8 (eighth transistor), the transparent connection wire TCL1, and the emission control line 155 are shown in the (2-2)-th display area DA2-2 (transparent display area). One anode (Arda2-2, Agda2-2, or Abda2-2) is connected to one transmission transistor T8 (eighth transistor). A gate electrode of the transmission transistor T8 (eighth transistor) is connected to the emission control line 155, and the emission control line 155 may be a wire through which a signal is transmitted so that the pixel circuit part outputs an emission current to the light emitting element and may be a wire connected to a gate electrode of an output control transistor included in the pixel circuit part. In addition, an input terminal of the transmission transistor T8 (eighth transistor) is connected to the transparent wire TCL1, and an output terminal thereof is connected to the anode (Arda2-2, Agda2-2, or Abda2-2). Referring to FIG. 2, the transmission transistor T8 (eighth transistor) entirely overlaps the red anode Arda2-2 and the blue anode Abda2-2 in a plan view, while it overlaps only a portion of the green anode Agda2-2 and does not overlap the remaining portion thereof, in a plan view. Referring to FIG. 2, the red anode Arda2-2 and the blue anode Abda2-2 receive the emission current from the transmission transistor T8 (eighth transistor) overlapping them in a plan view, and the green anode Agda2-2 receives the emission current from the transmission transistor T8 (eighth transistor) that partially overlaps the green anode Agda2-2. However, in some embodiments, the transmission transistor T8 (eighth transistor) may be formed to receive the emission current while being disposed so as to entirely overlap the green anode Agda2-2 or to not overlap it, in a plan view.

The transparent connection wire TCL1 is connected to the pixel circuit parts (Prda2-2, Pgda2-2, and Pbda2-2) for the (2-2)-th display area disposed in the (2-1)-th display area DA2-1 (intermediate display area) to receive the emission current and transmit it to the transmission transistor T8 (eighth transistor). In addition, the transparent connection wire TCL1 is made of a transparent conductive material, so that the transparent area of the (2-2)-th display area DA2-2 (transparent display area) may increase. By this structure, the (2-2)-th display area DA2-2 (transparent display area) is formed with relatively few constituent elements (the pixel circuit part and the wire, etc.) that blocks light compared with the first display area DA1 and the (2-1)-th display area DA2-1, so that the transparent area is sufficiently formed.

The transparent connection wire TCL1 includes a first portion extending in a y-direction perpendicular to an extension direction (x-direction) of the emission control line 155 and disposed in the (2-1)-th display area DA2-1, a second portion extending in the y-direction perpendicular to the extension direction (x-direction) of the emission control line 155 and disposed in the (2-2)-th display area DA2-2 (transparent display area), and a connection portion connecting the first portion and the second portion and formed in a direction parallel to the extension direction (x-direction) of the emission control line 155. Here, the first portion, the second portion, and the connection portion are integrally formed of the same transparent conductive material. A plurality of pixel circuit parts for the (2-2)-th display area (Prda2-2, Pgda2-2, and Pbda2-2) arranged along a column direction (y-direction) are connected by one first portion of the transparent connection wire TCL1. In addition, the transmission transistor T8 (eighth transistor) arranged along the column direction (y-direction) is connected by one second portion of the transparent connection wire TCL1. Since emission signals through the emission control line 155 applied to the transmission transistors T8 (eighth transistors) through one transparent connection wire TCL1 do not simultaneously turn on the transmission transistors T8 (eighth transistors) at the same time, the emission signals may not be applied while overlapping each other.

In the embodiment of FIG. 2, the (2-1)-th display area DA2-1 (intermediate display area) is disposed along the extension direction (x-direction) of the emission control line 155 from the (2-2)-th display area DA2-2 (transparent display area). That is, the first display area DA1 (normal display area), the (2-1)-th display area DA2-1 (intermediate display area), and the (2-2)-th display area DA2-2 (transparent display area) may be sequentially disposed along the extension direction (x-direction) of the emission control line 155. The emission control line 155 is entirely and continuously formed as a metal wire in the first display area DA1 and the second display area DA2. However, in some embodiments, it may be made of a transparent conductive material only in the (2-2)-th display area DA2-2 (transparent display area).

In some embodiments, a wire (a scan line, an initialization control line, etc.) required in the (2-1)-th display area DA2-1 (intermediate display area) or the first display area DA1 (normal display area) may pass the (2-2)-th display area DA2-2 (transparent display area). The passing wire may include a transparent conductive material, and may include a non-transparent metal in some embodiments. In some embodiments, the passing wire may be disposed along an outer periphery of the (2-2)-th display area DA2-2 (transparent display area).

According to the embodiment of FIG. 2, a sum of the number of the pixel circuit parts (Prda2-1, Pgda2-1, and Pbda2-1) for the (2-1)-th display area that are disposed in the (2-1)-th display area DA2-1 and the number of the pixel circuit parts (Prda2-2, Pgda2-2, and Pbda2-2) for the (2-2)-th display area is half of the number of the pixel circuit parts (Prda1, Pgda1, and Pbda1) disposed in the first display area DA1 (normal display area). Since the number of the pixel circuit parts (Prda2-1, Pgda2-1, and Pbda2-1) for the (2-1)-th display area disposed in the (2-1)-th display area DA2-1 (intermediate display area) and the number of the pixel circuit parts (Prda2-2, Pgda2-2, and Pbda2-2) for the (2-2)-th display area are the same, the number of the pixels (or light emitting elements) disposed in the (2-1)-th display area DA2-1 (intermediate display area) or the (2-2)-th display area DA2-2 (transparent display area) is ¼ of the number of the pixels (or light emitting elements) disposed in the first display area DA1 (normal display area).

However, in some embodiments (see FIG. 15), a sum of the number of the pixel circuit parts (Prda2-1, Pgda2-1, and Pbda2-1) for the (2-1)-th display area that are disposed in the (2-1)-th display area DA2-1 and the number of the pixel circuit parts (Prda2-2, Pgda2-2, and Pbda2-2) for the (2-2)-th display area may be the same as the number of the pixel circuit parts (Prda1, Pgda1, and Pbda1) disposed in the first display area DA1 (normal display area). In this case, the number of the pixels (or light emitting elements) disposed in the (2-1)-th display area DA2-1 (intermediate display area) or the (2-2)-th display area DA2-2 (transparent display area) may be ½ of the number of the pixels (or light emitting elements) disposed in the first display area DA1 (normal display area). Meanwhile, in some embodiments, the number of the pixels (or light emitting elements) disposed in the (2-1)-th display area DA2-1 (intermediate display area) or the (2-2)-th display area DA2-2 (transparent display area) may vary, and a ratio of the number of the light emitting elements between respective display areas may also vary.

In the above, the structures of the first display area DA1 and the second display area DA2 has been described as a whole based on FIG. 2.

Hereinafter, a structure for emitting a light emitting element in the (2-2)-th display area DA2-2 (transparent display area) of the second display area DA2 will be described with reference to FIG. 3.

Figure 3:
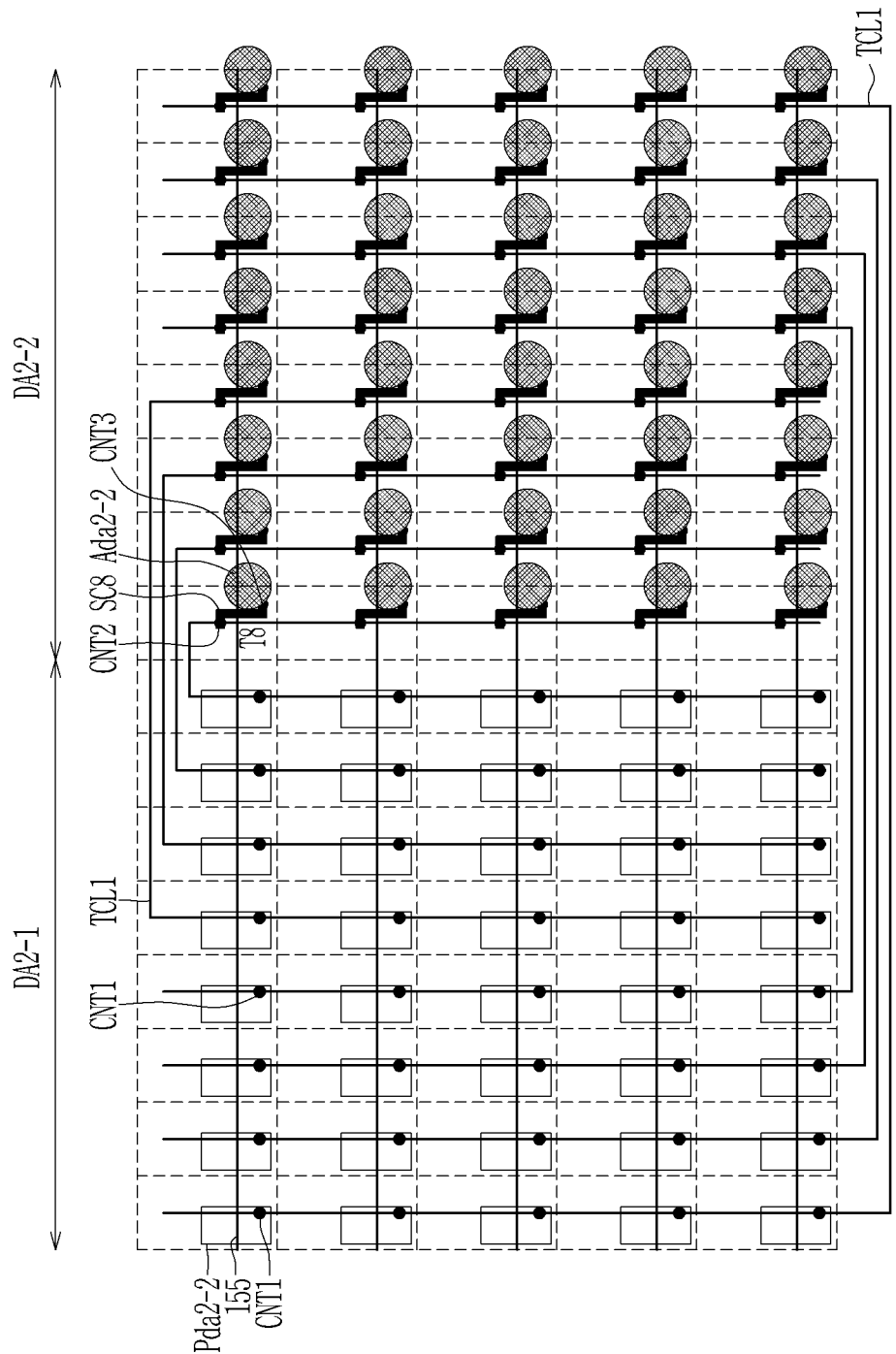
FIG. 3 illustrates a layout view based on some constituent elements of a second display area in a light emitting display device according to an embodiment.

FIG. 3 illustrates a layout view based on some constituent elements of the second display area in a light emitting display device according to an embodiment.

In FIG. 3, the (2-1)-th display area DA2-1 (intermediate display area) is shown, but the pixel circuit parts (Prda2-1, Pgda2-1, and Pbda2-1) for the (2-1)-th display area for emitting the light emitting element disposed in the (2-1)-th display area DA2-1 (intermediate display area) are not shown, while only the pixel circuit part Pda2-2 for the (2-2)-th display area is shown.

In FIG. 3, the pixel circuit parts (Prda2-1, Pgda2-1, and Pbda2-1) for the (2-1)-th display area may be disposed in an area in which the pixel circuit part Pda2-2 for the (2-2)-th display area is not positioned among the (2-1)-th display area DA2-1 (intermediate display area).

The pixel circuit part Pda2-2 for the (2-2)-th display area of the (2-1)-th display area DA2-1 (intermediate display area) is electrically connected to the transparent connection wire TCL1 through an opening CNT1. The transparent connection wire TCL1 extends to the (2-2)-th display area DA2-2 (transparent display area) to be electrically connected to an input terminal of the transmission transistor T8 (eighth transistor) through an opening CNT2. In FIG. 3, a semiconductor SC8 of the transmission transistor T8 (eighth transistor) is shown, and a structure in which the transparent connection wire TCL1 and an input side of the semiconductor SC8 are electrically connected through the opening CNT2 is shown. In addition, an output side of the semiconductor SC8 of the transmission transistor T8 (eighth transistor) is electrically connected to the anode Ada2-2 through an opening CNT3.

In the embodiment of FIG. 3, the transparent connection wire TCL1 is divided into a wire connected through an upper side thereof and a wire connected through a lower side thereof. It is illustrated that the first and second portions of the transparent connection wire TCL1 formed in the (2-1)-th display area DA2-1 (intermediate display area) and the (2-2)-th display area DA2-2 (transparent display area) have a structure in which wires close to a boundary between the (2-1)-th display area DA2-1 (intermediate display area) and the (2-2)-th display area DA2-2 (transparent display area) are connected to each other. According to this connection structure, the transparent connection wires TCL1 do not cross each other, so that they may be formed with one transparent conductive layer.

Meanwhile, the emission control line 155 is continuously formed in the (2-1)-th display area DA2-1 (intermediate display area) and the (2-2)-th display area DA2-2 (transparent display area), and the emission control line 155 crosses the semiconductor SC8 of the transmission transistor T8 (eighth transistor). A portion of the emission control lines 155 overlapping the semiconductor SC8 in a plan view configures a gate electrode of the transmission transistor T8 (eighth transistor), and a portion of the semiconductor SC8 overlapping the emission control line 155 in a plan view configures a channel of the transmission transistor T8 (eighth transistor.

The semiconductor SC8 may be formed of a silicon semiconductor or an oxide semiconductor, and portions (an input side and an output side) excluding the channel thereof may be doped or plasma-treated to have a conductive characteristic comparable to that of a conductor.

In FIG. 3, the transmission transistor T8 (eighth transistor) in the (2-2)-th display area DA2-2 (transparent display area) is shown at a position that does not overlap the anode Ada2-2 in a plan view. However, in order to widen the transparent area of the (2-2)-th display area DA2-2 (transparent display area), the transmission transistor T8 (eighth transistor) may overlap the anode Ada2-2 in a plan view.

As shown in FIG. 3, in the present embodiment, by a plurality of transmission transistors T8 (eighth transistors), a plurality of the anodes Ada2-2 of the (2-2)-th display area DA2-2 (transparent display area) and a plurality of the pixel circuit parts Pda2-2 for the (2-2)-th display area of the (2-1)-th display area DA2-1 (intermediate display area) are connected with one transparent connection wire TCL1. According to this embodiment, it is possible to reduce the number of connection wires compared to a comparative example. That is, since a plurality of the light emitting elements (or anodes Ada2-2) are connected by the transmission transistor T8 (eighth transistor), the light emitting element (or anode Ada2-2) may be formed in the (2-2)-th display area DA2-2 (transparent display area) beyond the limit of the connection wire, and the high resolution or PPI may be provided. In this case, the transparent connection wire TCL1 is used, so the transparent characteristic of the (2-2)-th display area DA2-2 (transparent display area) is not deteriorated. In addition, in some embodiments, the transmission transistor T8 (eighth transistor) may be formed to overlap the anode Ada2-2 or an light emitting element, so that the transparent characteristic of the (2-2)-th display area DA2-2 (transparent display area) may not be deteriorated.

FIG. 2 and FIG. 3 illustrate only the left (2-1)-th display area DA2-1 (intermediate display area) of the left and right (2-1)-th display areas DA2-1 (intermediate display area) shown in FIG. 1. However, the (2-1)-th display area DA2-1 (intermediate display area) may also be disposed at the right side, and in this case, a left-right symmetrical structure of FIG. 3 may be disposed at the right side.

Hereinafter, a method of forming the transmission transistor T8 (eighth transistor) and the anode Ada2-2 in the (2-2)-th display area DA2-2 (transparent display area) will be sequentially described with reference to FIG. 4.

Figure 4:
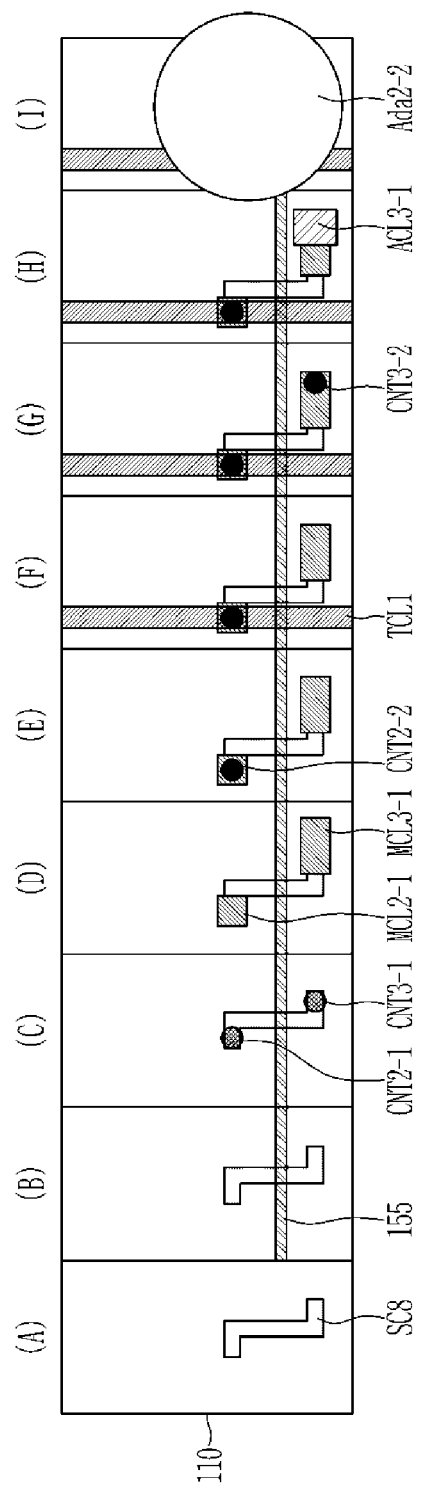
FIG. 4 illustrates a drawing of a manufacturing step of an eighth transistor and a peripheral structure of a (2-2)-th display area in a light emitting display device according to an embodiment.

FIG. 4 illustrates a drawing of a manufacturing step of the transmission transistor T8 (eighth transistor) and the peripheral structure of the (2-2)-th display area in the light emitting display device according to the embodiment.

In FIG. 4, the step (A) shows a step of forming the semiconductor SC8 on a substrate 110 by a silicon semiconductor or an oxide semiconductor. Next, after forming an insulation film covering the semiconductor SC8, as shown in the step (B), the emission control line 155 is formed. After the emission control line 155 is formed, the semiconductor SC8 is doped with the emission control line 155 as a mask or plasma-treated to make a conductor excluding the channel such that it has characteristics similar to that of a conductor. Next, after forming an insulation film covering the emission control line 155, as shown in the step (C), the portions of the input side and output side of the semiconductor SC8 are exposed by forming openings (CNT2-1 and CNT3-1) in the insulating layer. Next, as shown in the step (D), connection members (MCL2-1 and MCL3-1) covering the openings (CNT2-1 and CNT3-1) are formed. Next, an insulation film covering the connection member (MCL2-1 and MCL3-1) is formed, and as shown in the step (E), an opening CNT2-2 exposing the connection member MCL2-1 is formed. Next, as shown in the step (F), the transparent connection wire TCL1 is formed to be electrically connected to the connection member MCL2-1 and the input side of the semiconductor SC8 through the opening CNT2-2. Next, after forming an insulation layer covering the transparent connection wire TCL1, as shown in the step (G), an opening CNT3-2 is formed to expose a portion of the connection member MCL3-1. Next, as shown in the step (H), an anode connecting member ACL3-1 is formed to be electrically connected to the connection member MCL3-1 and the output side of the semiconductor SC8 through the opening CNT3-2. Next, as shown in the step (I), the anode Ada2-2 that is electrically connected to the anode connection member ACL3-1 is formed.

According to this structure, the transmission transistor T8 (eighth transistor) is turned on by an emission control signal transmitted through the emission control line 155, and in this case, the emission current transmitted to the transparent connection wire TCL1 is transmitted to the anode Ada2-2.

In some embodiments, an insulation film, an opening, and a connection member may be further included, or some thereof may be omitted.

In addition, although each process shown in FIG. 4 is to form the transmission transistor T8 (eighth transistor), the transparent connection wire TCL1, and the anode Ada2-2 in the (2-2)-th display area DA2-2 (transparent display area), they may be formed together with the process of forming the pixel circuit part in the first display area DA1 (normal display area) and the (2-1)-th display area DA2-1 (intermediate display area). That is, the transistor included in the pixel circuit part may form the semiconductor and the gate electrode together with the steps (A) and (B), and a portion of the semiconductor may be made into a conductor through a doping process or plasma process.

However, in some embodiments, the pixel circuit part including a transistor not including a semiconductor used by mixing the two may be used, and hereinafter, an embodiment having the pixel circuit part including both a transistor using a silicon semiconductor and a transistor using an oxide semiconductor will be described with reference to FIGS. 5, 6, 7, 8, and 9.

Figure 5:
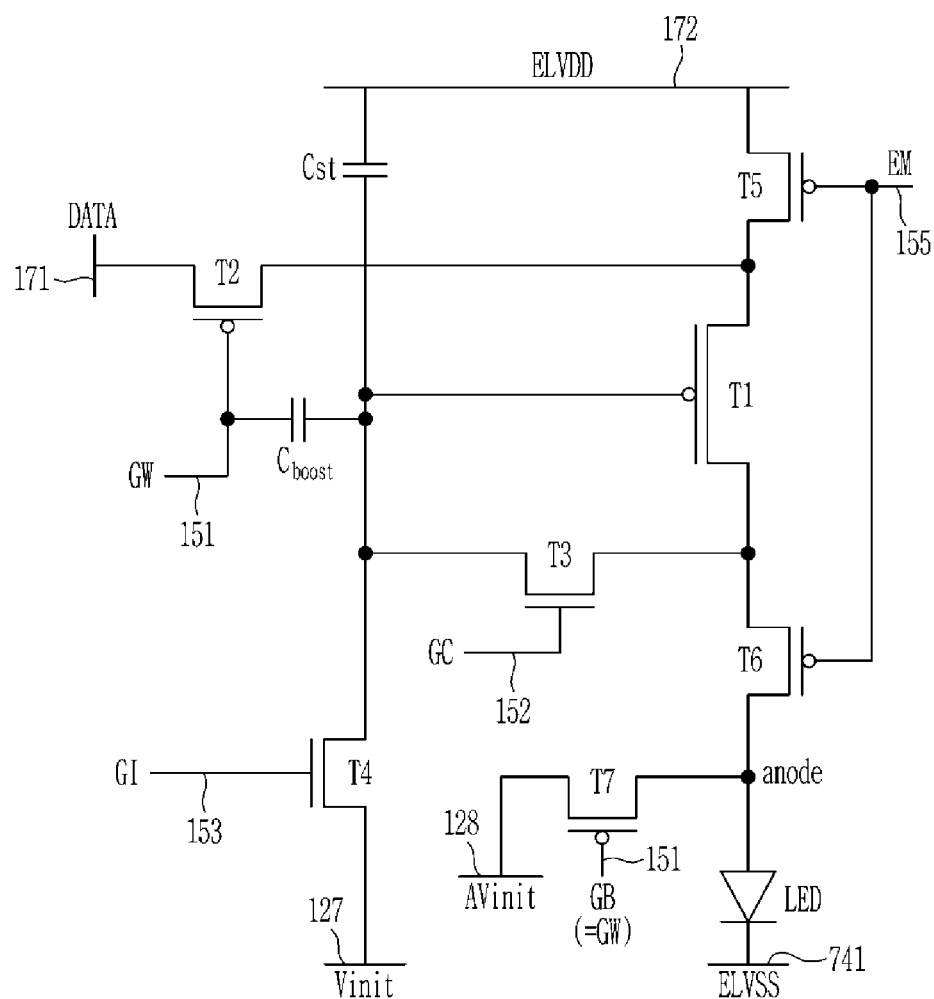
FIG. 5 and FIG. 6 illustrate circuit diagrams of one pixel included in a display device according to an embodiment.
Figure 6:
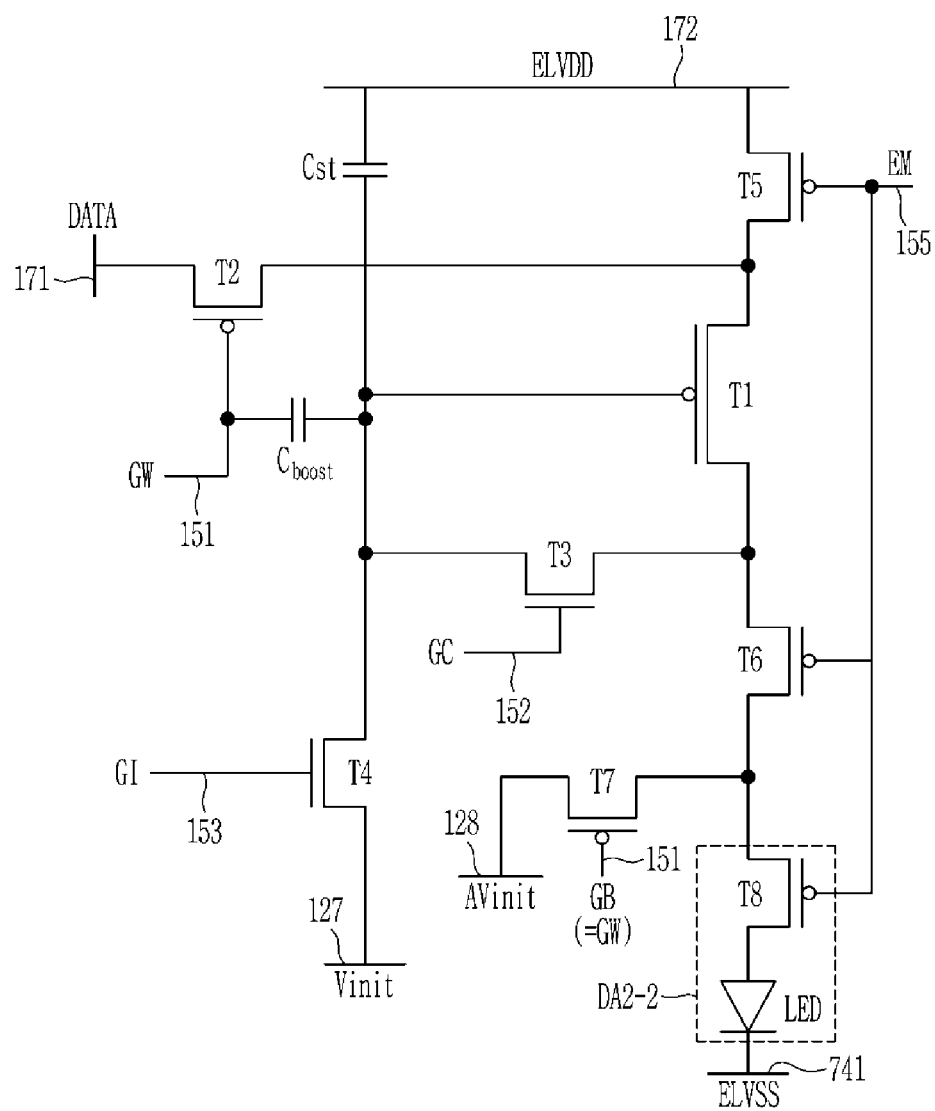
Figure 7:
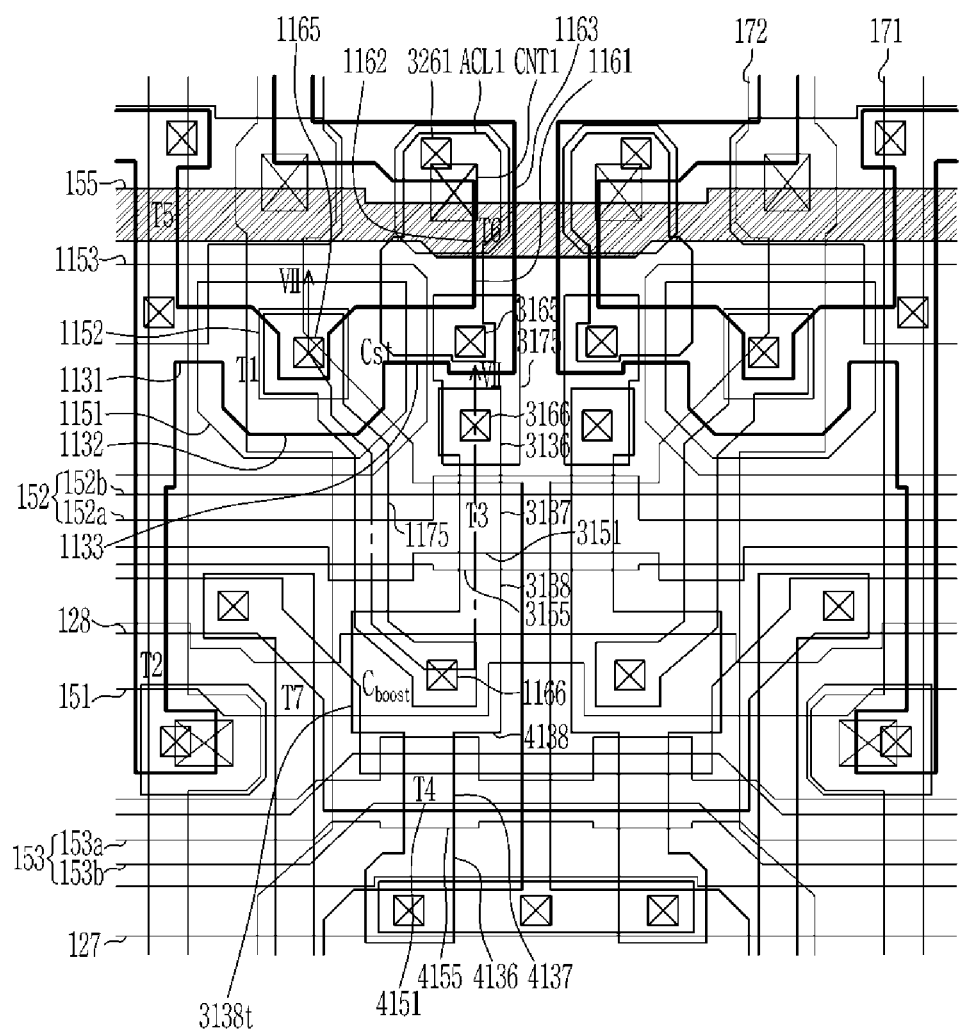
FIG. 7 illustrates a layout view of a pixel according to an embodiment.
Figure 8:
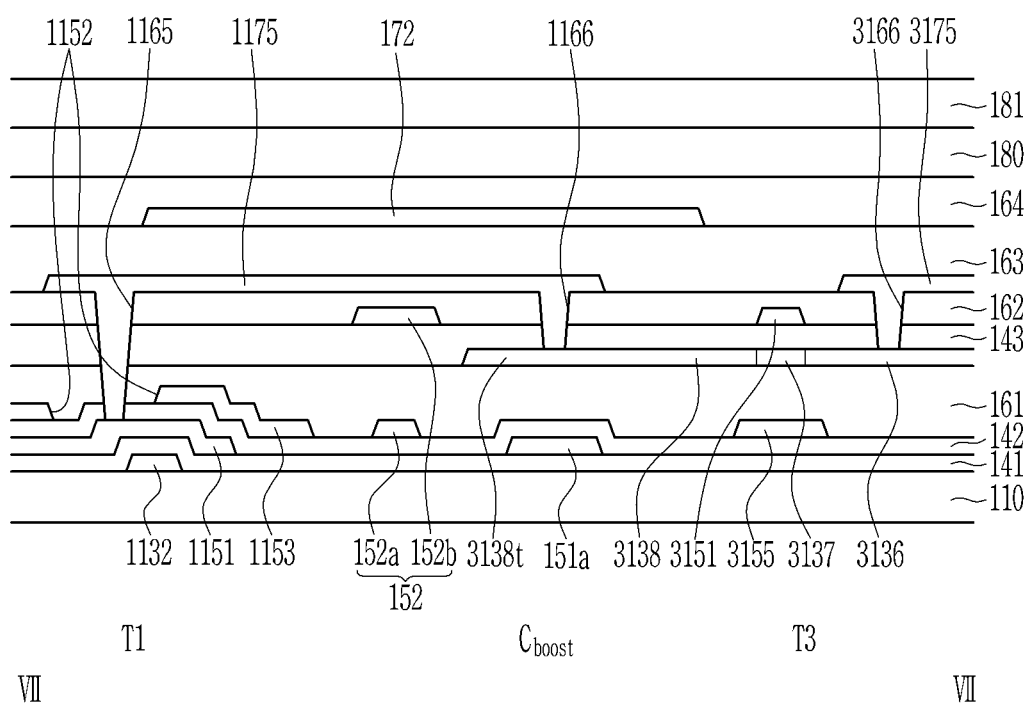
FIG. 8 illustrates a cross-sectional view taken along line VII-VII' of FIG. 7.
Figure 9:
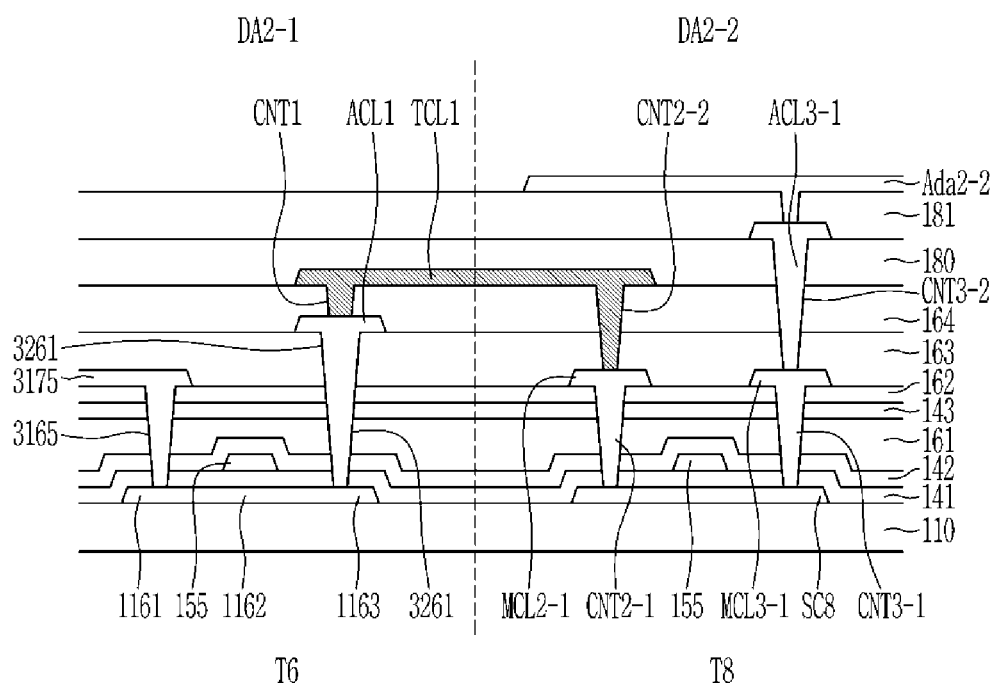
FIG. 9 illustrates a cross-sectional view of a sixth transistor and an eighth transistor in a second display area in a light emitting display device according to an embodiment.

FIG. 5 and FIG. 6 illustrate circuit diagrams of one pixel included in a display device according to an embodiment, FIG. 7 illustrates a layout view of a pixel according to an embodiment, FIG. 8 illustrates a cross-sectional view taken along line VII-VII' of FIG. 7, and FIG. 9 illustrates a cross-sectional view of a sixth transistor and an eighth transistor in a second display area in a light emitting display device according to an embodiment.

Firstly, a circuit structure of one pixel including the pixel circuit part and the light emitting element will be described with reference to FIG. 5 and FIG. 6.

A circuit structure illustrated in FIG. 5 is a circuit structure of the pixel circuit part and the light emitting element formed in the first display area DA1 (normal display area) and the (2-1)-th display area DA2-1 (intermediate display area), and a circuit structure illustrated in FIG. 6 is a circuit structure in which the pixel circuit part is disposed in the (2-1)-th display area DA2-1 (intermediate display area), and the light emitting element and the transmission transistor T8 (eighth transistor) are disposed in the (2-2)-th display area DA2-2 (transparent display area).

A circuit structure of the pixel disposed in the first display area DA1 (normal display area), the pixel circuit part for the (2-1)-th display area formed in the (2-1)-th display area DA2-1 (intermediate display area), and the light emitting element disposed in the (2-1)-th display area DA2-1 (intermediate display area) will be described with reference to FIG. 5.

One pixel according to the embodiment includes transistors T1, T2, T3, T4, T5, T6, and T7, a storage capacitor Cst, a boost capacitor $C_{boost}$, and a light emitting element LED connected to a plurality of wires 127, 128, 151, 152, 153, 155, 171, 172, and 741. Here, the light emitting element LED is a light emitting diode, and the transistors and the capacitors form a pixel circuit part. In some embodiments, the boost capacitor $C_{boost}$ may be omitted.

The plurality of wires 127, 128, 151, 152, 153, 155, 171, 172, and 741 are connected to one pixel PX. The plurality of wires includes a first initialization voltage line 127, a second initialization voltage line 128, a first scan line 151, a second scan line 152, an initialization control line 153, an emission control line 155, a data line 171, a driving voltage line 172, and a common voltage line 741. In the embodiment of FIG. 5, the first scan line 151 connected to the seventh transistor T7 is also connected to the second transistor T2, but in some embodiments, the seventh transistor T7, unlike the second transistor T2, may be connected to a bypass control line.

The first scan line 151 is connected to a scan driver (not shown) to transmit a first scan signal GW to the second transistor T2 and the seventh transistor T7. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The emission control line 155 transmits an emission control signal EM to the fifth transistor T5 and the sixth transistor T6.

The data line 171 is a line that transmits a data voltage DATA generated by a data driver (not shown), and thus, as an amount of a current transmitted to the light emitting element LED is changed, and luminance emitted by the light emitting element LED is also changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting element LED. In the present embodiment, each of voltages applied to the driving voltage line 172, the first and second initialization voltage lines 127 and 128, and the common voltage line 741 may be a constant voltage.

The driving transistor T1 (also referred to as the first transistor) is a p-type transistor, and has a silicon semiconductor as a semiconductor layer. It is a transistor that adjusts the amount of emission current outputted to the anode of the light emitting element LED according to a voltage (that is, a voltage stored in the storage capacitor Cst) of a gate electrode of the driving transistor T1. Since brightness of the light emitting element LED is adjusted according to an amount of an emission current outputted to the anode electrode of the light emitting element LED, light emission luminance of the light emitting element LED may be adjusted according to the data voltage DATA applied to the pixel. For this purpose, a first electrode of the driving transistor T1 is disposed to receive the driving voltage ELVDD, and is connected to the driving voltage line 172 via the fifth transistor T5. In addition, the first electrode of the driving transistor T1 is connected to a second electrode of the second transistor T2 to receive the data voltage DATA. Meanwhile, a second electrode of the driving transistor T1 outputs the emission current to the light emitting element LED, and is connected to the anode of the light emitting element LED via the sixth transistor T6 (hereinafter referred to as an output control transistor). In addition, the second electrode of the driving transistor T1 is also connected to the third transistor T3 to transmit the data voltage DATA applied to the first electrode thereof to the third transistor T3. Meanwhile, a gate electrode of the driving transistor T1 is connected to one electrode of the storage capacitor Cst (hereinafter referred to as a 'second storage electrode'). Accordingly, a voltage of the gate electrode of the driving transistor T1 is changed according to a voltage stored in the storage capacitor Cst, and therefore, an emission current outputted from the driving transistor T1 is changed. The storage capacitor Cst serves to maintain the voltage of the gate electrode of the driving transistor T1 constant for one frame. Meanwhile, the gate electrode of the driving transistor T1 may also be connected to the third transistor T3 so that the data voltage DATA applied to the first electrode of the driving transistor T1 passes through the third transistor T3 to be transmitted to the gate electrode of the driving transistor T1. Meanwhile, the gate electrode of the driving transistor T1 may also be connected to the fourth transistor T4 to be initialized by receiving the first initialization voltage Vinit.

The second transistor T2 is a p-type transistor, and has a silicon semiconductor as a semiconductor layer. The second transistor T2 is a transistor that allows the data voltage DATA to be received into the pixel. A gate electrode of the second transistor T2 is connected to the first scan line 151 and one electrode of the boost capacitor $C_{boost}$ (hereinafter, referred to as a 'lower boost electrode'). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1, and finally, the data voltage DATA is transmitted to the gate electrode of the driving transistor T1 to be stored in the storage capacitor Cst.

The third transistor T3 is an n-type transistor, and has an oxide semiconductor as a semiconductor layer. The third transistor T3 electrically connects the second electrode of the driving transistor T1 and the gate electrode of the driving transistor T1. As a result, it is a transistor that allows the data voltage DATA to be compensated by a threshold voltage of the driving transistor T1 and then stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and an electrode of the boost capacitor $C_{boost}$ (hereinafter referred to as an 'upper boost electrode'). The third transistor T3 is turned on by a positive voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is an n-type transistor, and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

The fifth transistor T5 and the sixth transistor T6 are p-type transistors, and have silicon semiconductors as a semiconductor layer.

The fifth transistor T5 serves to transmit the driving voltage ELVDD to the driving transistor T1. A gate electrode of the fifth transistor T5 is connected to the emission control line 155, a first electrode of the fifth transistor T5 is connected to the driving voltage line 172, and a second electrode of the fifth transistor T5 is connected to the first electrode of the driving transistor T1.

The sixth transistor T6 serves to transmit an emission current outputted from the driving transistor T1 to the light emitting element LED. A gate electrode of the sixth transistor T6 is connected to the emission control line 155, a first electrode of the sixth transistor T6 is connected to the second electrode of the driving transistor T1, and a second electrode of the sixth transistor T6 is connected to the anode of the light emitting element LED.

The seventh transistor T7 is a p-type transistor, and has a silicon semiconductor or oxide semiconductor as a semiconductor layer. The seventh transistor T7 serves to initialize the anode of the light emitting element LED. A gate electrode of the seventh transistor T7 is connected to the first scan line 151, a first electrode of the seventh transistor T7 is connected to the anode of the light emitting element LED, and a second electrode of the seventh transistor T7 is connected to the second initialization voltage line 128. When the seventh transistor T7 is turned on by a negative voltage of the first scan line 151, the second initialization voltage AVint is applied to the anode of the light emitting element LED to initialize it. Meanwhile, the gate electrode of the seventh transistor T7 may be connected to a separate bypass control line, and may separately control it from the first scan line 151. In addition, in some embodiments, the second initialization voltage line 128 to which the second initialization voltage AVinit is applied may be the same as the first initialization voltage line 127 to which the first initialization voltage Vinit is applied.

It is described that one pixel PX includes the seven transistors T1 to T7 and two capacitors (the storage capacitor Cst and the boost capacitor $C_{boost}$), but the present disclosure is not limited thereto, and in some embodiments, the boost capacitor $C_{boost}$ may be removed. In addition, although the third transistor and the fourth transistor are formed as n-type transistors, only one of them may be formed as an n-type transistor or the other thereof may be formed as an n-type transistor.

In the above, the circuit structure of the pixel disposed in the first display area DA1 (normal display area), the pixel circuit part for the (2-1)-th display area formed in the (2-1)-th display area DA2-1 (intermediate display area), and the light emitting element disposed in the (2-1)-th display area DA2-1 (intermediate display area) has been described with reference to FIG. 5.

Therefore, hereinafter, a circuit structure of the pixel circuit part for the (2-2)-th display area formed in the (2-1)-th display area DA2-1 (intermediate display area) and of the light emitting element disposed in the (2-2)-th display area DA2-2 (intermediate display area) will be described with reference to FIG. 6.

In the circuit structure shown in FIG. 6, the pixel circuit part is disposed in the (2-1)-th display area DA2-1 (intermediate display area), and the light emitting element and transmission transistor T8 (eighth transistor) are disposed in the (2-2)-th display area DA2-2 (transparent display area).

In FIG. 6, it is clearly shown that constituent elements of the circuit structure disposed in the (2-2)-th display area DA2-2 (transparent display area) are the light emitting element LED and the transmission transistor T8 (eighth transistor) formed in a dotted line.

In FIG. 6, the structure of the pixel circuit part for the (2-2)-th display area formed in the (2-1)-th display area DA2-1 (intermediate display area) is the same as that of FIG. 5. That is, one pixel circuit part includes seven transistors (T1 to T7) and two capacitors (the storage capacitor Cst and the boost capacitor $C_{boost}$).

Hereinafter, the constituent elements in FIG. 6 disposed in the (2-2)-th display area DA2-2 (transparent display area), which are parts that are different from FIG. 5, will be described.

In the pixel circuit part for the (2-2)-th display area formed in the (2-1)-th display area DA2-1 (intermediate display area), the emission current outputted from the sixth transistor T6 is transmitted to the transmission transistor T8 (eighth transistor). Referring to FIGS. 2, 3, and 4, the connection between the sixth transistor T6 and the transmission transistor T8 (eighth transistor) may be realized through the transparent connection wire TCL1.

The transmission transistor T8 (eighth transistor) disposed in the (2-2)-th display area DA2-2 (transparent display area), like the sixth transistor T6, is a p-type transistor and has a silicon semiconductor as a semiconductor layer.

The transmission transistor T8 (eighth transistor) serves to receive the emission current outputted from the driving transistor T1 through the sixth transistor T6 then to transmit it to the light emitting element LED disposed in the (2-2)-th display area DA2-2 (transparent display area). A gate electrode of the transmission transistor T8 (eighth transistor) is connected to the emission control line 155, a first electrode of the transmission transistor T8 (eighth transistor) is connected to the second electrode of the sixth transistor T6, and a second electrode of the transmission transistor T8 (eighth transistor) is connected to the anode of the light emitting element LED.

The gate electrodes of the transmission transistor T8 (eighth transistor), the sixth transistor T6, and the fifth transistor T5 are all connected to the emission control line 155, so that they are controlled by the same emission signal and are turned on at the same timing.

In some embodiments, when the sixth transistor T6 is an n-type transistor including an oxide semiconductor, the transmission transistor T8 (eighth transistor) may also be an n-type transistor including an oxide semiconductor. That is, the sixth transistor T6 and the transmission transistor T8 (eighth transistor) may be transistors having the same characteristic, and the sizes (lengths and widths) of the channels thereof may also be identically formed.

Hereinafter, an arrangement and cross-sectional structure of the pixel circuit part disposed in the first display area DA1 (normal display area) having the circuit structure of FIG. 5 and the pixel circuit part for the (2-1)-th display area formed in the (2-1)-th display area DA2-1 (intermediate display area) will be described with reference to FIG. 7 and FIG. 8.

A first semiconductor layer formed of a silicon semiconductor is disposed on the substrate 110. The first semiconductor layer includes a channel 1132, a first area 1131, and a second area 1133 of the driving transistor T1. In addition, the first semiconductor layer includes not only the channel of the driving transistor T1, but also the channels of the second transistor T2, the fifth transistor T5, the sixth transistor T6, and the seventh transistor T7, and both sides of each channel have areas having conductive layer characteristics formed by plasma treatment or doping to serve as first electrodes and second electrodes. The substrate 110 may include a material that has a rigid characteristic such as glass and thus is not bent, or may include a flexible material such as plastic or polyimide that may be bent.

A channel 1132 of the driving transistor T1 may have a curved shape in a plan view. However, the shape of the channel 1132 of the driving transistor T1 is not limited thereto, and may be variously changed. For example, the channel 1132 of the driving transistor T1 may be bent in a different shape, or may be formed in a rod shape. A first area 1131 and a second area 1133 of the driving transistor T1 may be disposed at respective sides of the channel 1132 of the driving transistor T1. The first area 1131 and the second area 1133 disposed at the first semiconductor layer serve as the first electrode and the second electrode of the driving transistor T1. The first area 1131 of the driving transistor T1 extends in an up/down direction (second direction) in FIG. 4, the portion extending downward is connected to the second electrode of the second transistor T2, and the portion extending upward is connected to the second electrode of the fifth transistor T5. The second area 1133 of the driving transistor T1 extends upward in a plan view to be connected to the first electrode of the sixth transistor T6, and it extends downward to be connected to the third transistor T3.

A first gate insulation film 141 may be disposed on the first semiconductor layer including the channel 1132, the first area 1131, and the second area 1133 of the driving transistor T1. The first gate insulation film 141 may include an inorganic insulation material such as a silicon nitride (SiNx), a silicon oxide (SiOx), and a silicon oxynitride (SiOxNy).

A first gate conductive layer including a gate electrode 1151 of the driving transistor T1 may be disposed on the first gate insulation film 141. The first gate conductive layer includes the gate electrode of each of the driving transistor T1, the second transistor T2, the fifth transistor T5, the sixth transistor T6, and the seventh transistor T7, and a lower boost electrode 151a of the boost capacitor $C_{boost}$. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first scan line 151 and the emission control line 155. The first scan line 151 and the emission control line 155 may substantially extend in a horizontal direction. The first scan line 151 may be connected to the gate electrode of the second transistor T2. The first scan line 151 may be integrated with the gate electrode of the second transistor T2. The first scan line 151 is connected to the gate electrode of the seventh transistor T7, and the gate electrode of the fifth transistor T5 and the gate electrode of the sixth transistor T6 are connected to the emission control line 155.

After the first gate conductive layer including the gate electrode 1151 of the driving transistor T1 is formed, the exposed area of the first semiconductor layer may be conductive by performing a plasma treatment or a doping process. That is, the first semiconductor layer covered by the first gate conductive layer is not conductive, and a portion of the first semiconductor layer that is not covered by the first gate conductive layer may have the same characteristic as the conductive layer. As a result, the transistor including the conductive portion has a p-type transistor characteristic, so that the driving transistor T1, the second transistor T2, the fifth transistor T5, the sixth transistor T6, and the seventh transistor T7 may be p-type transistors.

A second gate insulation film 142 may be disposed on the first gate conductive layer and the first gate insulation film 141 including the gate electrode 1151 of the driving transistor T1. The second gate insulation film 142 may include an inorganic insulation material such as a silicon nitride (SiNx), a silicon oxide (SiOx), and a silicon oxynitride (SiOxNy).

A second gate conductive layer including a first storage electrode 1153 of the storage capacitor Cst, a lower shielding layer 3155 of the third transistor T3, and a lower shielding layer 4155 of the fourth transistor T4 may be disposed on the second gate insulation film 142. The lower shielding layers 3155 and 4155 may be disposed under the channels of the third transistor T3 and the fourth transistor T4, respectively, and may serve to shield light or electromagnetic interference provided to the channels from lower sides thereof.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The lower shielding layer 3155 of the third transistor T3 may overlap a channel 3137 and a gate electrode 3151 of the third transistor T3. The lower shielding layer 4155 of the fourth transistor T4 may overlap a channel 4137 and a gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may substantially extend in the horizontal direction. The lower second scan line 152a may be connected to the lower shielding layer 3155 of the third transistor T3. The lower second scan line 152a may be integrally formed with the lower shielding layer 3155 of the third transistor T3. The lower initialization control line 153a may be connected to the lower shielding layer 4155 of the fourth transistor T4. The lower initialization control line 153a may be integrally formed with the lower shielding layer 4155 of the fourth transistor T4.

A first interlayer insulation film 161 may be disposed on the second gate conductive layer including the first storage electrode 1153 of the storage capacitor Cst, the lower shielding layer 3155 of the third transistor T3, and the lower shielding layer 4155 of the fourth transistor T4. The first interlayer insulation film 161 may include an inorganic insulation material such as a silicon nitride (SiNx), a silicon oxide (SiOx), and a silicon oxynitride (SiOxNy), and in some embodiments, the inorganic insulating material may be thickly formed therein. However, in some embodiments, it may also include an organic material.

An oxide semiconductor layer including the channel 3137, a first area 3136, and a second area 3138 of the third transistor T3, and the channel 4137, a first area 4136, and a second area 4138 of the fourth transistor T4, may be disposed on the first interlayer insulation film 161. In addition, the oxide semiconductor layer may include an upper boost electrode 3138t of the capacitor $C_{boost}$.

The channel 3137, the first area 3136, and the second area 3138 of the third transistor T3, and the channel 4137, the first area 4136, and the second area 4138 of the fourth transistor T4, may be connected to each other to be integrally formed. The first area 3136 and the second area 3138 of the third transistor T3 are disposed at both sides of the channel 3137 of the third transistor T3, and the first area 4136 and the second area 4138 of the fourth transistor T4 are disposed at both sides of the channel 4137 of the fourth transistor T4.

The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155.

The upper boost electrode 3138*t* of the boost capacitor $C_{boost}$ overlaps the lower boost electrode 151*a* of the boost capacitor $C_{boost}$ to form the boost capacitor $C_{boost}$.

A third gate insulation film 143 may be disposed on the oxide semiconductor layer including the channel 3137, the first area 3136, and the second area 3138 of the third transistor T3, and the channel 4137, the first area 4136, and the second area 4138 of the fourth transistor T4, and the upper boost electrode 3138*t* of the boost capacitor $C_{boost}$.

The third gate insulation film 143 may be disposed on an entire surface of the oxide semiconductor layer and the first interlayer insulation film 161. Therefore, the third gate insulation film 143 may cover upper and lateral surfaces of the channel 3137, the first area 3136, and the second area 3138 of the third transistor T3, may cover upper and lateral surfaces of the channel 4137, the first area 4136, and the second area 4138 of the fourth transistor T4, and may cover upper and lateral surfaces of the upper boost electrode 3138*t* of the boost capacitor $C_{boost}$. However, the present embodiment is not limited thereto, and the third gate insulation film 143 may not be disposed on the entire surface of the oxide semiconductor layer and the first interlayer insulation film 161. For example, the third gate insulation film 143 may overlap the channel 3137 of the third transistor T3, and it may not overlap the first area 3136 and the second area 3138 thereof. In addition, the third gate insulation film 143 may overlap the channel 4137 of the fourth transistor T4, and it may not overlap the first area 4136 and the second area 4138 thereof.

A third gate conductive layer including the gate electrode 3151 of the third transistor T3 and the gate electrode 4151 of the fourth transistor T4 may be disposed on the third gate insulation film 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152*b* and an upper initialization control line 153*b*.

The upper second scan line 152*b* and the upper initialization control line 153*b* may substantially extend in the horizontal direction. The upper second scan line 152*b* forms the second scan line 152 together with the lower second scan line 152*a*. The upper second scan line 152*b* may be connected to the gate electrode 3151 of the third transistor T3. The upper second scan line 152*b* may be integrally formed with the gate electrode 3151 of the third transistor T3. The upper initialization control line 153*b* forms the initialization control line 153 together with the lower initialization control line 153*a*. The upper initialization control line 153*b* may be connected to the gate electrode 4151 of the fourth transistor T4. The upper initialization control line 153*b* may be integrally formed with the gate electrode 4151 of the fourth transistor T4.

After the third gate conductive layer including the gate electrode 3151 of the third transistor T3 and the gate electrode 4151 of the fourth transistor T4 is formed through a plasma treatment or doping process, a portion of the oxide semiconductor layer that is covered by the third gate conductive layer is formed as a channel, and a portion of the oxide semiconductor layer that is not covered by the third gate conductive layer is conductive. The channel 3137 of the third transistor T3 may be disposed under the gate electrode 3151 to overlap the gate electrode 3151. The first area 3136 and the second area 3138 of the third transistor T3 may not overlap the gate electrode 3151. The channel 4137 of the fourth transistor T4 may be disposed under the gate electrode 4151 to overlap the gate electrode 4151. The first area 4136 and the second area 4138 of the fourth transistor T4 may not overlap the gate electrode 4151. The upper boost electrode 3138*t* may not overlap the third gate conductive layer. A transistor including an oxide semiconductor layer may have characteristics of an n-type transistor.

A second interlayer insulation film 162 may be disposed on the third gate conductive layer including the gate electrode 3151 of the third transistor T3 and the gate electrode 4151 of the fourth transistor T4. The second interlayer insulation film 162 may have a single layered or multi-layered structure. The second interlayer insulation film 162 may include an inorganic insulation material such as a silicon nitride (SiNx), a silicon oxide (SiOx), and a silicon oxynitride (SiOxNy), and in some embodiments, it may include an organic material. The second interlayer insulation film 162 may include a first opening 1165, a second opening 1166, a third opening 3165, and a fourth opening 3166.

The first opening 1165 may overlap at least a portion of the gate electrode 1151 of the driving transistor T1. The first opening 1165 may be formed in the third gate insulation film 143, the first interlayer insulation film 161, and the second gate insulation film 142. The first opening 1165 may overlap the opening 1152 of the first storage electrode 1153. The first opening 1165 may be disposed inside the opening 1152 of the first storage electrode 1153.

The second opening 1166 may overlap at least a portion of the boost capacitor $C_{boost}$. The second opening 1166 may be further formed in the third gate insulation film 143.

The third opening 3165 may overlap at least a portion of the second area 1133 of the driving transistor T1. The third opening 3165 may be further formed in the third gate insulation film 143, the first interlayer insulation film 161, the second gate insulation film 142, and the first gate insulation film 141.

The fourth opening 3166 may overlap at least a portion of the first area 3136 of the third transistor T3. The fourth opening 3166 may be further formed in the third gate insulation film 143.

A first data conductive layer including a first connection electrode 1175 and a second connection electrode 3175 may be disposed on the second interlayer insulation film 162.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the boost capacitor $C_{boost}$. The first connection electrode 1175 may be connected to the upper boost electrode 3138*t* of the boost capacitor $C_{boost}$ through the second opening 1166. Accordingly, the gate electrode 1151 of the driving transistor T1 and the upper boost electrode 3138*t* of the boost capacitor $C_{boost}$ may be connected by the first connection electrode 1175. In this case, the gate electrode 1151 of the driving transistor T1 may be connected to the second area 3138 of the third transistor T3 and the second area 4138 of the fourth transistor T4 by the first connection electrode 1175.

The second connection electrode 3175 may overlap the second area 1133 of the driving transistor T1. The second connection electrode 3175 may be connected to the second area 1133 of the driving transistor T1 through the third opening 3165. The second connection electrode 3175 may overlap the first area 3136 of the third transistor T3. The second connection electrode 3175 may be connected to the first area 3136 of the third transistor T3 through the fourth opening 3166. Accordingly, the second area 1133 of the driving transistor T1 and the first area 3136 of the third transistor T3 may be connected by the second connection electrode 3175.

The first data conductive layer may further include the second initialization voltage line 128. The second initialization voltage line 128 may approximately extend in the horizontal direction.

A first organic film 163 may be disposed on the first data conductive layer including the first connection electrode 1175 and the second connection electrode 3175. The first organic film 163 may be made of an organic material.

A second data conductive layer including the data line 171 and the driving voltage line 172 may be disposed on the first organic film 163. The data line 171 and the driving voltage line 172 may substantially extend in the vertical direction (second direction). The data line 171 may be connected to the second transistor T2. The driving voltage line 172 may be connected to the fifth transistor T5. In addition, the driving voltage line 172 may be connected to the first storage electrode 1153.

Referring to FIG. 9, the second data conductive layer may additionally include an anode connection member ACL1. The anode connection member ACL1 is connected to the first organic film 163 and to a second area 1163 of the sixth transistor T6 exposed by an opening 3261 formed in an insulation film thereunder. The anode connection member ACL1 is exposed by the opening CNT1 to be electrically connected to the anode.

An additional organic film 164, a second organic film 180, and a third organic film 181 may be disposed on the second data conductive layer including the data line 171, the driving voltage line 172, and the anode connection member ACL1. The additional organic film 164, the second organic film 180, and the third organic film 181 may be made of an organic material.

Although not shown in FIG. 7 and FIG. 8, the transparent conductive wire TCL1 may be disposed above the second organic film 180 and in the (2-1)-th display area DA2-1 (intermediate display area), and the transparent conductive wire TCL1 is covered by the third organic film 181.

In addition, although not shown in FIG. 7 and FIG. 8, the anode may be disposed on the third organic film 181. A pixel defining layer may be formed on the anode while overlapping one end of the anode. An opening formed in the pixel defining layer exposes the anode, and a light emitting element layer is formed within the opening, and then a cathode is formed on the pixel defining layer and the light emitting element layer, thereby completing a light emitting element LED including the anode, the light emitting element layer, and the cathode. Meanwhile, an encapsulation layer covering the cathode may be further included on the cathode.

In the above, the actual arrangement structure of the pixel circuit part in the first display area DA1 (normal display area) and the pixel circuit part for the (2-1)-th display area formed in the (2-1)-th display area DA2-1 (intermediate display area) has been described with reference to the structure of FIG. 5.

Hereinafter, a cross-sectional structure and a connection relationship of the sixth transistor T6 of the pixel circuit part of the (2-1)-th display area DA2-1 (intermediate display area) will be described, based on the cross-sectional structure of the anode Ada2-2 and the transmission transistor T8 (eighth transistor) disposed in the (2-2)-th display area DA2-2 (transparent display area), with reference to FIG. 6.

The sixth transistor T6 of the (2-1)-th display area DA2-1 (intermediate display area) and the transmission transistor T8 (eighth transistor) of the (2-2)-th display area DA2-2 (transparent display area) have the same cross-sectional structure.

That is, the channels of the sixth transistor T6 and the transmission transistor T8 (eighth transistor) are disposed on the first semiconductor layer disposed on the substrate 110. The first area 1161 and the second area 1163 are disposed at both sides of the channel 1162 of the sixth transistor T6 of the first semiconductor layer. The first area and the second area are also disposed at both sides of the channel of the transmission transistor T8 (eighth transistor).

The first gate insulation layer 141 is disposed on the first semiconductor layer that includes the channel 1162, the first area 1161, and the second area 1163 of the sixth transistor T6, and the channel, the first area, and the second area of the transmission transistor T8 (eighth transistor).

The gate electrodes 155 of the sixth transistor T6 and the transmission transistor T8 (eighth transistor) are disposed on the first gate insulation layer 141. The gate electrodes 155 of the sixth transistor T6 and the transmission transistor T8 (eighth transistor) overlap respective channels thereof. The gate electrodes 155 of the sixth transistor T6 and the transmission transistor T8 (eighth transistor) are a portion of the emission control line 155, and may be integrally formed.

In the sixth transistor T6 and the transmission transistor T8 (eighth transistor), the exposed area of the first semiconductor layer may be made conductive by performing plasma treatment or a doping process on the first semiconductor layer by using the gate electrode 155 as a mask. That is, the first semiconductor layer is not made conductive as the gate electrode 155 to form a channel, and a portion of the first semiconductor layer not covered by the gate electrode 155 is made conductive to have the same characteristics as the conductive layer.

The second gate insulation film 142, the first interlayer insulation film 161, the third gate insulation film 143, and the second interlayer insulation film 162 may be sequentially disposed on the gate electrodes 155 of the sixth transistor T6 and the transmission transistor T8 (eighth transistor).

An opening is formed in the first gate insulation film 141, the second gate insulation film 142, the first interlayer insulation film 161, the third gate insulation film 143, and the second interlayer insulation film 162 to expose a portion of the first semiconductor layer.

The first area 1161 of the sixth transistor T6 is exposed by the opening 3165, and the second area 1133 of the driving transistor T1 and the first area 1161 of the sixth transistor T6 are electrically connected by the second connection electrode 3175 disposed on the second interlayer insulation film 162.

The first area and the second area of the first semiconductor layer of the transmission transistor T8 (eighth transistor) are respectively exposed by the opening, and are connected to the first area and the second area of the transmission transistor T8 (eighth transistor) by the connection members (MCL2-1 and MCL3-1).

The second connection electrode 3175 and the connection members (MCL2-1 and MCL3-1) are formed on the first data conductive layer, and are covered with the first organic film 163 covering the first data conductive layer.

The opening 3261 is formed in the first organic film 163 and the insulation films 162, 143, 161, 142, and 141 therebelow, and the second area 1163 of the sixth transistor T6 is exposed by the opening 3261. The anode connecting member ACL1 is formed with the second data conductive layer on the first organic film 163 to be connected to the second area 1163 of the sixth transistor T6.

The additional organic film 164 covering the second data conductive layer is disposed, and the anode connection member ACL1 and the connection member MCL2-1 are exposed by the openings CNT1 and CNT2-2, respectively. The anode connection member ACL1 and the connection member MCL2-1 exposed by the openings CNT1 and CNT2-2 are connected to each other by the transparent connection wire TCL1 disposed on the additional organic film 164. The transparent connection wire TCL1 is covered by the second organic film 180. The second organic film 180, the additional organic film 164, and the first organic film 163 are formed with the opening CNT3-2, and the connection member MCL3-1 is exposed by the opening CNT3-2. The exposed connection member MCL3-1 is connected to the anode connection member ACL3-1 disposed on the second organic film 180. The anode connection member ACL3-1 is covered by the third organic film 181, and the anode Ada2-2 and the anode connection member ACL3-1 are connected through an opening disposed in the third organic film 181.

According to the cross-sectional structure as shown in FIG. 9, the emission current outputted from the sixth transistor T6 in the (2-1)-th display area DA2-1 (intermediate display area) may be transmitted to the anode Ada2-2 through the transmission transistor T8 (the eighth transistor) of the (2-2)-th display area DA2-2 (transparent display area).

Hereinafter, a structure in which a portion of the anode disposed in the (2-2)-th display area DA2-2 (transparent display area) is connected by using the transmission transistor T8, and the remaining portion thereof is directly connected to the pixel circuit part for the (2-2)-th display area of the (2-1)-th display area DA2-1 (intermediate display area) by the transparent wire without the transmission transistor T8 (eighth transistor), will be described with reference to FIGS. 10, 11, 12, 13, and 14.

Firstly, a structure of the embodiment of FIG. 10 will be described as follows.

Figure 10:
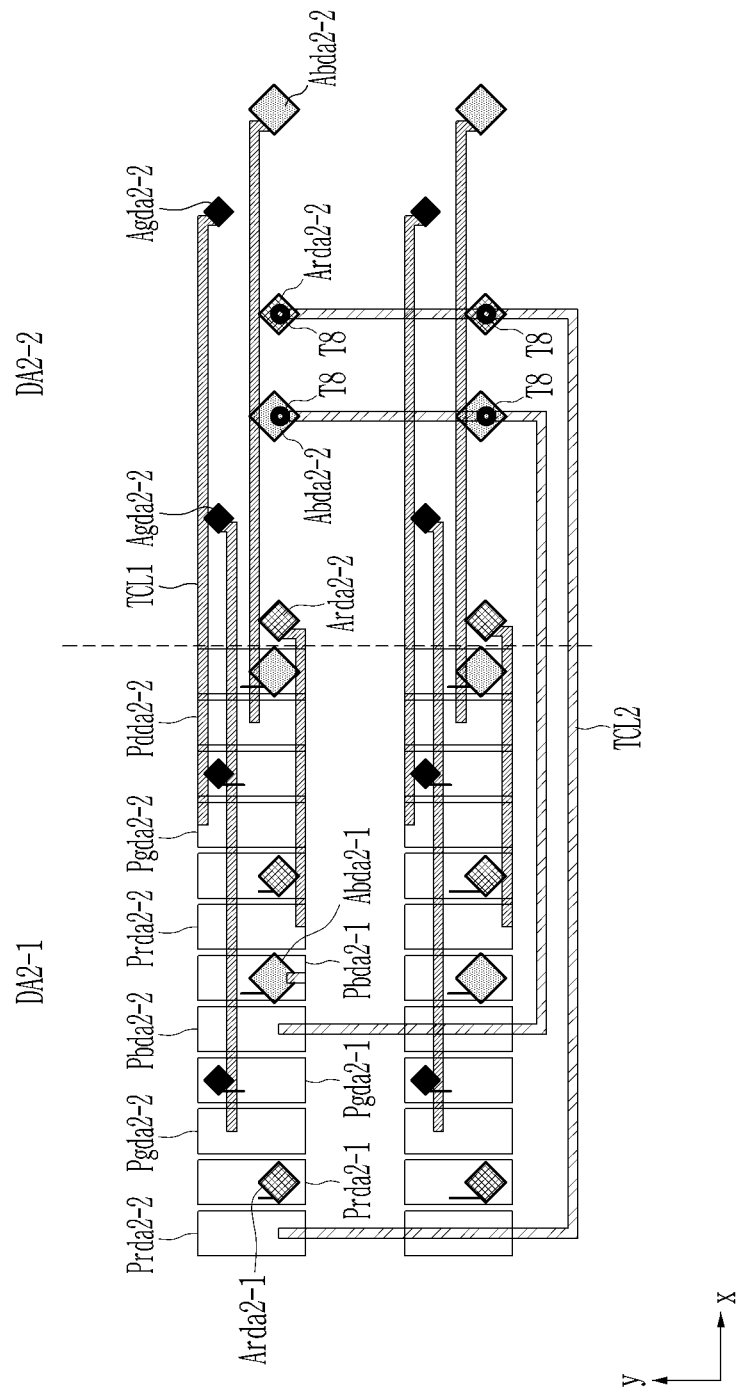
FIG. 10 illustrates a layout view of a second display area in a light emitting display device according to an embodiment.

FIG. 10 illustrates a layout view of a second display area in a light emitting display device according to an embodiment.

In FIG. 10, the anodes (Arda2-2, Agda2-2, and Abda2-2) disposed in the (2-2)-th display area DA2-2 (transparent display area) may be classified into a first anode and a second anode, and the first anode is an anode that receives the emission current through only the transparent connection wire TCL1 without the transmission transistor T8 (eighth transistor). Meanwhile, the second anode is an anode that receives the emission current by using one transparent connection wire TCL2 and the transmission transistor T8 (eighth transistor).

In FIG. 10, a plurality of pixel circuit parts (Prda2-1, Prda2-2, Pgda2-1, Pgda2-2, Pbda2-1, and Pbda2-2) and a plurality of light emitting elements are disposed in the (2-1)-th display area DA2-1 (intermediate display area), and FIG. 10 illustrates the anodes (Arda2-1, Agda2-1, and Abda2-1) of the plurality of light emitting elements. The plurality of pixel circuit parts (Prda2-1, Prda2-2, Pgda2-1, Pgda2-2, Pbda2-1, and Pbda2-2) of the (2-1)-th display area DA2-1 are divided into the pixel circuit parts (Prda2-1, Pgda2-1, and Pbda2-1) for the (2-1)-th display area and the pixel circuit parts (Prda2-2, Pgda2-2, and Pbda2-2) for the (2-2)-th display area. The pixel circuit parts (Prda2-1, Pgda2-1, and Pbda2-1) for the (2-1)-th display area are pixel circuit parts that transmits an emission current to the anodes (Arda2-1, Agda2-1, and Abda2-1) disposed in the (2-1)-th display area DA2-1 (intermediate display area). The pixel circuit parts (Prda2-1, Pgda2-1, and Pbda2-1) for the (2-1)-th display area and the anodes (Arda2-1, Agda2-1, and Abda2-1) disposed in the (2-1)-th display area DA2-1 (intermediate display area) may correspond to each other one-to-one.

The pixel circuit parts (Prda2-2, Pgda2-2, and Pbda2-2) for the (2-2)-th display area are disposed in the (2-1)-th display area DA2-1 (intermediate display area), however, it generates an emission current to be transmitted to the light emitting element disposed in the (2-2)-th display area DA2-2 (transparent display area).

In the embodiment of FIG. 10, the pixel circuit parts (Prda2-1, Pgda2-1, and Pbda2-1) for the (2-1)-th display area and the pixel circuit parts (Prda2-2, Pgda2-2, and Pbda2-2) for the (2-2)-th display area are alternately disposed. However, in some embodiments, they may be disposed in various arrangements.

In addition, in the embodiment of FIG. 10, three pixels are used as a unit pixel and are repeatedly arranged. The three pixels configuring one unit pixel consists of one red pixel, one blue pixel, and one green pixel. However, in some embodiments, at least one red pixel, at least one green pixel, and at least one blue pixel are included.

In some of the pixel circuit parts (Prda2-2, Pgda2-2, and Pbda2-2) for the (2-2)-th display area, each pixel circuit part is connected to one transparent connection wire TCL1, and one transparent connection wire TCL1 is connected to one anode of the (2-2)-th display area DA2-2 (transparent display area). The transparent connection wire TCL1 extends in the first direction. In this case, referring to FIG. 11, the transparent connection wire TCL1 may be disposed on the second organic film 180, and may be covered with the third organic film 181.

Meanwhile, the remaining some of the pixel circuit parts (Prda2-2, Pgda2-2, and Pbda2-2) for the (2-2)-th display area include the transmission transistor T8 (eighth transistor) to transmit the emission current while using a small number of transparent connection wires TCL2. That is, the plurality of pixel circuit parts are connected by one transparent connection wire TCL2, and one transparent connection wire TCL2 is connected to the plurality of transmission transistors T8 (eighth transistors) even in the (2-2)-th display area DA2-2 (transparent display area) to transmit the emission currents to the plurality of anodes. Although the emission control line 155 is not shown in FIG. 10, it extends in the first direction and is connected to the gate electrode of the transmission transistor T8 (eighth transistor). As a result, it may be turned on by the emission signal applied to the emission control line 155, and the emission current is transmitted to the anode connected to the turned-on transmission transistor T8 (eighth transistor).

In FIG. 10, the transparent connection wire TCL2 includes a first portion extending in a direction (y-direction) perpendicular to an extending direction (x-direction) of the emission control line 155 and disposed in the (2-1)-th display area DA2-1, a second portion extending in the direction (y-direction) perpendicular to the extending direction (x-direction) of the emission control line 155 and disposed in the (2-2)-th display area DA2-2 (transparent display area), and a connection portion connecting the first portion and the second portion and formed in a direction parallel to the extending direction (x-direction) of the emission control line 155. In this case, referring to FIG. 11, the transparent connection wire TCL2 may be disposed on the second interlayer insulation film 162, and may be covered with the first organic film 163. That is, the two transparent connection wires TCL1 and TCL2 may cross each other in a plan view by disposing them on different layers.

The transmission transistor T8 (eighth transistor) may overlap the anode of the (2-2)-th display area DA2-2 (transparent display area) in a plan view, and the transparent connection wire TCL2 is made of a transparent conductive material, so that the transparent area of the (2-2)-th display area DA2-2 (transparent display area) may not be reduced.

In FIG. 10, four anodes connected by using the transmission transistor T8 (eighth transistor) are shown, and eight anodes connected without using the transmission transistor T8 (eighth transistor) are shown. However, whether to form them by the transmission transistor T8 (eighth transistor) may be determined by considering the number of transparent wires that may be formed in an area of the (2-2)-th display area DA2-2 (transparent display area), and when it is necessary to connect a plurality of the anodes with one wire, they may be formed to be connected by using the transmission transistor T8 (eighth transistor). In this case, the number of the anodes connected by using the transmission transistor T8 (eighth transistor) may further decrease. However, in some embodiments, it is also possible to connect all or a large number of the anodes by using the transmission transistor T8 (eighth transistor) as shown in FIG. 2 and FIG. 3.

Hereinafter, a cross-sectional structure according to an embodiment that is different from that of FIG. 8 and FIG. 9 will be described with reference to FIG. 11.

Figure 11:
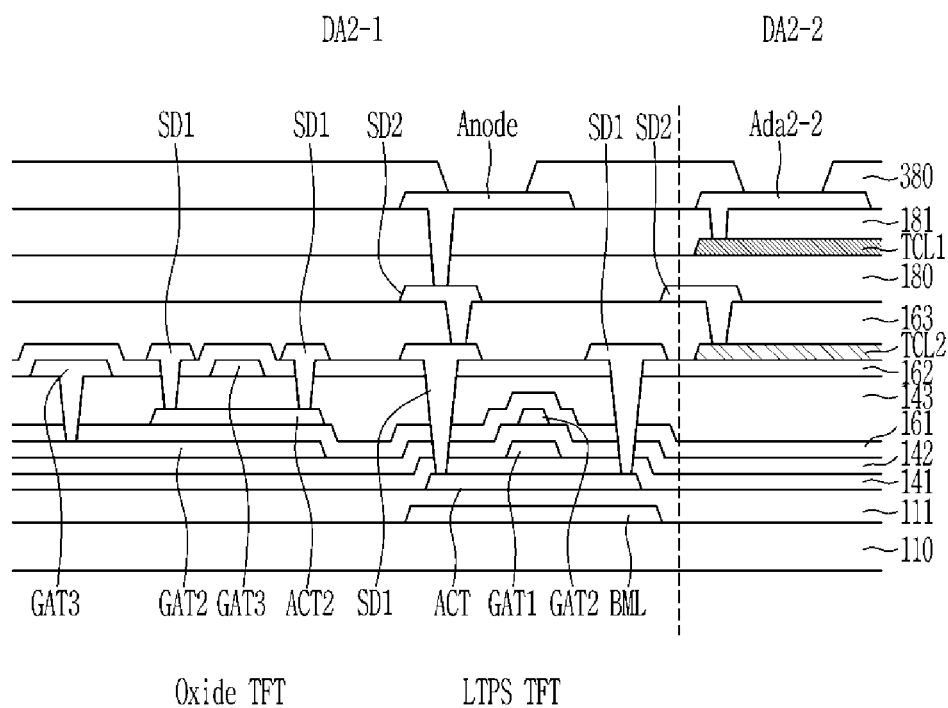
FIG. 11 illustrates a cross-sectional view of a layered structure of a first display area and a second display area in a light emitting display device according to an embodiment.

FIG. 11 illustrates a cross-sectional view of a layered structure of a first display area and a second display area in a light emitting display device according to an embodiment.

Referring to FIG. 11, unlike FIG. 8 and FIG. 9, a metal layer BML and a buffer layer 111 are disposed between a substrate 110 and a first semiconductor layer ACT. The metal layer BML may overlap a channel of a transistor.

The cross-sectional structure of FIG. 11 includes two transparent connection wires TCL1 and TCL2, unlike that of FIG. 8 and FIG. 9, and one transparent connection wire TCL1 is disposed on the second organic film 180 and covered with the third organic film 181, and the other transparent connection wire TCL2 is disposed on the second interlayer insulating film 162 and covered with the first organic film 163.

An entire cross-sectional structure will be described based on a layered structure of a transistor (LTPS TFT) including a silicon semiconductor and a transistor (oxide TFT) including an oxide semiconductor as a transistor of the pixel circuit part with reference to FIG. 11.

In FIG. 11, the substrate 110 may include a material that has a rigid characteristic such as glass and thus is not bent, or may include a flexible material such as plastic or polyimide that may be bent.

The metal layer BML is disposed on the substrate 110, and the metal layer BML is disposed in an area overlapping the channel of the first semiconductor layer ACT. The metal layer BML is also referred to as a lower shielding layer, and may contain a metal such as copper (Cu), molybdenum (Mo), aluminum (Al), and titanium (Ti), or a metal alloy thereof, and may be formed as a single layer or multilayer.

The buffer layer 111 covering the metal layer BML may be disposed on the metal layer BML, and the buffer layer serves to block impurity elements from penetrating into the first semiconductor layer, and may be an inorganic insulation film including a silicon oxide (SiOx), a silicon nitride (SiNx), or a silicon oxynitride (SiONx).

The first semiconductor layer ACT is disposed on the buffer layer 111. The first semiconductor layer ACT includes a channel area, and a first area and a second area disposed at both sides of the channel area.

The first gate insulation film 141 may be disposed to cover the first semiconductor layer ACT or overlap only the channel area of the first semiconductor layer ACT. The first gate insulation film 141 may be an inorganic insulation film including a silicon oxide (SiOx), a silicon nitride (SiNx), or a silicon oxynitride (SiONx).

The first gate conductive layer GAT1 is disposed on the first gate insulation film 141, and the first gate conductive layer GAT1 includes a gate electrode of the transistor (LTPS TFT) including a silicon semiconductor. The first gate conductive layer GAT1 may include a metal such as copper (Cu), molybdenum (Mo), aluminum (Al), or titanium (Ti), or a metal alloy thereof, and may be formed as a single layer or multilayer. An area of the first semiconductor layer ACT that overlaps the gate electrode 124 in a plan view may be a channel area.

The first gate conductive layer GAT1 is covered with the second gate insulation film 142, and the second gate insulation film 142 may be an inorganic insulation film including a silicon oxide (SiOx), a silicon nitride (SiNx), or a silicon oxynitride (SiONx).

A second gate conductive layer GAT2 is disposed on the second gate insulation film 142, and the second gate conductive layer GAT2 includes a gate electrode, a first storage electrode configuring a storage capacitor, and a lower shielding layer for an oxide semiconductor transistor disposed under the oxide semiconductor layer ACT2. The second gate conductive layer GAT2 may include a metal such as copper (Cu), molybdenum (Mo), aluminum (Al), or titanium (Ti), or a metal alloy thereof, and may be formed as a single layer or multilayer.

The second gate conductive layer GAT2 is covered by the first interlayer insulation film 161, and the first interlayer insulation film 161 may include an inorganic insulation film including a silicon oxide (SiOx), a silicon nitride (SiNx), or a silicon oxynitride (SiONx).

An oxide semiconductor layer ACT2 is disposed on the first interlayer insulation film 161, and the oxide semiconductor layer ACT2 includes a channel area, and a first area and a second area disposed at respective sides of the channel area.

The oxide semiconductor layer ACT2 is covered by the third gate insulation film 143, and the third gate insulation film 143 may include an inorganic insulation film including a silicon oxide (SiOx), a silicon nitride (SiNx), or a silicon oxynitride (SiONx).

The third gate insulation film 143 and the first interlayer insulation film 161 may have an opening overlapping a portion of a lower shielding layer for an oxide semiconductor transistor of the second gate conductive layer GAT2.

A third gate conductive layer GAT3 is disposed on the third gate insulation film 143, and the third gate conductive layer GAT3 includes a gate electrode of the oxide semiconductor transistor and a connection member connected to the lower shielding layer for the oxide semiconductor transistor.

The third gate conductive layer GAT3 may include a metal such as copper (Cu), molybdenum (Mo), aluminum (Al), or titanium (Ti), or a metal alloy thereof, and may be formed as a single layer or multilayer.

The third gate conductive layer GAT3 is covered by the second interlayer insulation film 162, and the second interlayer insulation film 162 may include an inorganic insulation film including a silicon oxide (SiOx), a silicon nitride (SiNx), or a silicon oxynitride (SiONx), and in some embodiments, it may include an organic material.

The second interlayer insulation film 162 and the insulation film disposed under the second interlayer insulation film 162 may include an opening overlapping the first semiconductor layer ACT and the oxide semiconductor layer ACT2.

A first data conductive layer SD1 is disposed on the second interlayer insulation film 162, and the first data conductive layer SD1 may include a connection member to serve to provide a voltage or current to the first semiconductor layer ACT and the oxide semiconductor layer ACT2 or to transmit the voltage or current to other elements. The first data conductive layer SD1 may include a metal such as aluminum (Al), copper (Cu), molybdenum (Mo), or titanium (Ti), or a metal alloy thereof, and may be formed as a single layer or multilayer.

Here, in the light emitting display device according to the embodiment of FIG. 11, the transparent connection wire TCL2 may be formed on the second interlayer insulation film 162. The transparent connection wire TCL2 is made of a transparent conductive material such as an indium-tin oxide (ITO), an indium-zinc oxide (IZO), or an indium-gallium-zinc oxide (IGZO) to be disposed on the second interlayer insulation film 162, but it may be formed by using a separate mask from the data conductive layer SD1. As shown in FIG. 10, the transparent connection wire TCL2 may be a wire that connects the pixel circuit part disposed in the (2-1)-th display area DA2-1 (intermediate display area) and the transmission transistor T8 (eighth transistor) disposed in the (2-2)-th display area DA2-2 (transparent display area). The structure of the transmission transistor T8 (eighth transistor) may have a cross-sectional structure of the transistor (LTPS TFT) including the silicon semiconductor of FIG. 11.

The first data conductive layer SD1 and the transparent connection wire TCL2 are covered by the first organic film 163. The first organic film 163 may be an organic insulation film including an organic material, and the organic material may include one or more of polyimide, polyamide, an acryl resin, benzocyclobutene, and a phenol resin.

The first organic film 163 may include an opening overlapping the first data conductive layer SD1 and the transparent connection wire TCL2, and a second data conductive layer SD2 is disposed on the first organic film 163. The second data conductive layer SD2 may be connected to the first data conductive layer SD1 or the transparent connection wire TCL2 through the opening. The second data conductive layer SD2 may include a metal such as aluminum (Al), copper (Cu), molybdenum (Mo), or titanium (Ti), or a metal alloy thereof, and may be formed as a single layer or multilayer.

The second data conductive layer SD2 is covered by the second organic film 180. The second organic film 180 may be an organic insulation film, and may include one or more of polyimide, polyamide, an acryl resin, benzocyclobutene, and a phenol resin.

The transparent connection wire TCL1 made of a transparent conductive material such as an indium-tin oxide (ITO), an indium-zinc oxide (IZO), or an indium-gallium-zinc oxide (IGZO) is disposed on the second organic film 180. As shown in FIG. 10, the transparent connection wire TCL2 may be a wire that connects the pixel circuit part disposed in the (1-1)-th display area DA2-1 (intermediate display area) and the anode disposed in the (2-2)-th display area DA2-2 (transparent display area).

The transparent connection wire TCL1 is covered by the third organic film 181. The third organic film 181 may be an organic insulation film, and may include one or more of polyimide, polyamide, an acryl resin, benzocyclobutene, and a phenol resin.

The anode layers (Anode and Ada2-2) may be disposed on the third organic film 181, and are connected to the second data conductive layer SD2 or the transparent connection wire TCL1 through the opening disposed in the third organic film 181 and/or the second organic film 180. The anode disposed in the (2-2)-th display area DA2-2 (transparent display area) and connected to the transparent connection wire TCL2 may be electrically connected through the second data conductive layer SD2, which is electrically connected to the transparent connection wire TCL2. The anode layers (Anode and Ada2-2) may be formed as a single layer including a transparent conductive oxide film or a metal material, or a multilayer including them. The transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), and aluminum (Al).

A pixel defining layer 380 that covers at least a portion of the anode while exposing the anode may be disposed on the anode layers (Anode and Ada2-2). The pixel defining layer (PDL) 380 is also referred to as a partition wall, and may be an organic insulation film including one or more of polyimide, polyamide, an acryl resin, benzocyclobutene, and a phenol resin. In addition, in some embodiments, the pixel defining layer 380 may be formed as a black pixel defining layer (PDL) having a black color.

In the above, the embodiment using two transparent connection wires TCL1 and TCL2 has been described with reference to FIG. 10 and FIG. 11.

Hereinafter, an embodiment including a plurality of light emitting elements (hereinafter, referred to as copy light emitting elements) receiving the same emission current will be described with reference to FIGS. 12, 13, and 14.

A modified embodiment of FIG. 10 will be described with reference to FIG. 12.

Figure 12:
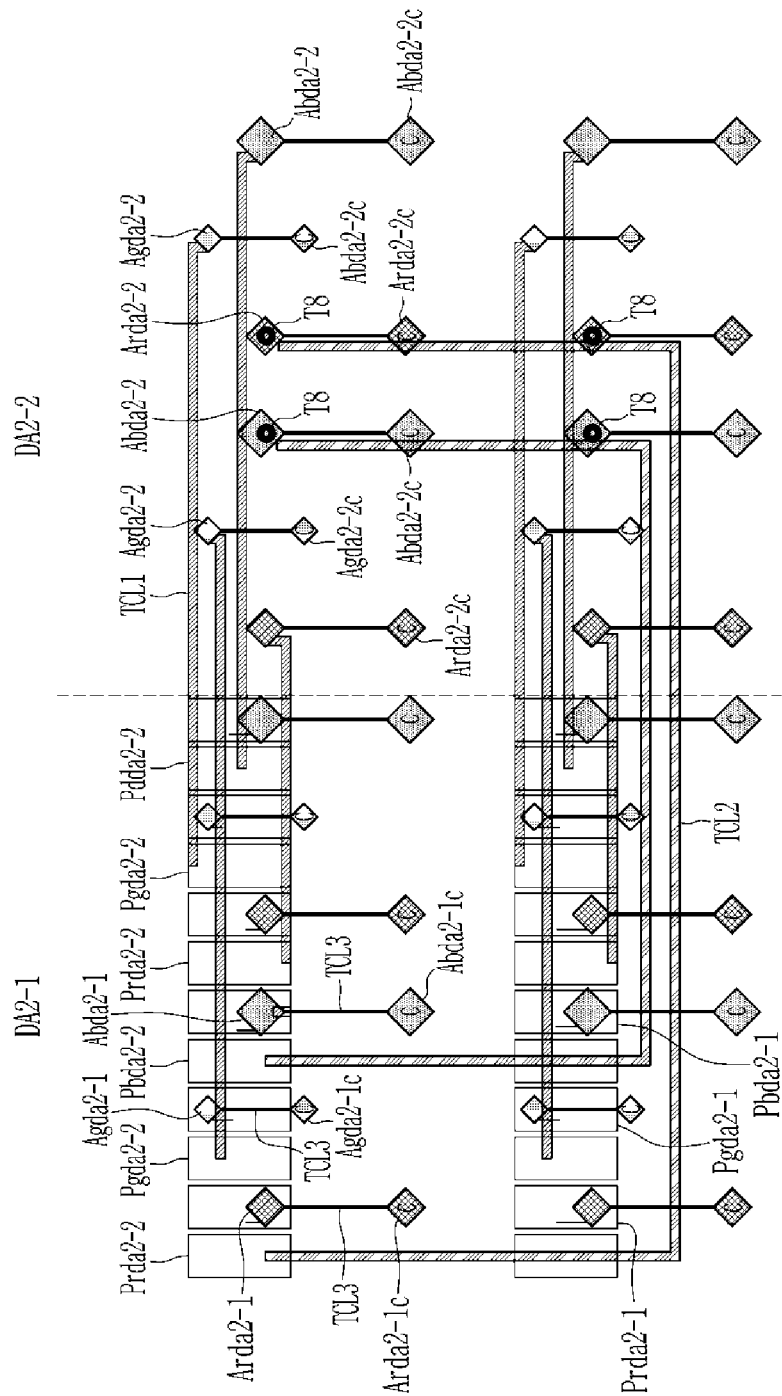
FIG. 12 illustrates a layout view of a second display area in a light emitting display device according to an embodiment.

FIG. 12 illustrates a layout view of a second display area in a light emitting display device according to an embodiment.

The embodiment of FIG. 12 further includes a transparent connection wire TCL3 and copy anodes (Arda2-1c, Agda2-1c, Abda2-1c, Arda2-2c, Agda2-2c, and Abda2-2c) connected thereto in addition to the embodiment of FIG. 10. The copy anodes (Arda2-1c, Agda2-1c, Abda2-1c, Arda2-2c, Agda2-2c, and Abda2-2c) are indicated by "c" in FIG. 12.

The anodes (Arda2-1, Agda2-1, Abda2-1, Arda2-2, Agda2-2, and Abda2-2) are anodes to which the emission current is directly applied from the pixel circuit parts (Prda2-1, Prda2-2, Pgda2-1, Pgda2-2, Pbda2-1, and Pbda2-2), and the transparent connection wire TCL3 transmits the same emission current from the anodes (Arda2-1, Agda2-1, Abda2-1, Arda2-2, Agda2-2, and Abda2-2) or the pixel circuit parts (Prda2-1, Prda2-2, Pgda2-1, Pgda2-2, Pbda2-1, and Pbda2-2) to the copy anodes (Arda2-1c, Agda2-1c, Abda2-1c, Arda2-2c, Agda2-2c, and Abda2-2c).

The light emitting element including the copy anode (Arda2-1c, Agda2-1c, Abda2-1c, Arda2-2c, Agda2-2c, and Abda2-2c) is a copy light emitting element, and it receives the same emission current and emits light of the same luminance, together with the mother light emitting element including the mother anode (Arda2-1, Agda2-1, Abda2-1, Arda2-2, Agda2-2, and Abda2-2).

Such a copy light emitting element may be formed in the (2-1)-th display area DA2-1 (intermediate display area) and the (2-2)-th display area DA2-2 (transparent display area), and thus it provides an effect that seems to be a large number of pixels. Particularly, copy light emitting elements make the number of pixels in the second display area seem like as many as the number of the first display area DA1 (normal display area). The copy light emitting element may not be formed in the first display area DA1 (normal display area).

The copy anodes (Arda2-1c, Agda2-1c, and Abda2-1c) formed in the (2-1)-th display area DA2-1 (intermediate display area) are connected to the mother anodes (Arda2-1, Agda2-1, and Abda2-1) by the transparent connection wires TCL3.

Meanwhile, the copy anodes (Arda2-2c, Agda2-2c, and Abda2-2c) disposed in the (2-2)-th display area DA2-2 (transparent display area) are connected to the mother anodes (Arda2-2, Agda2-2, and Abda2-2) by the transparent connection wires TCL1 and TCL2.

The copy anodes (Arda2-2c, Agda2-2c, and Abda2-2c) disposed in the (2-2)-th display area DA2-2 (transparent display area) are classified into a case of being connected to the anode receiving the emission current through only the transparent connection wire TCL1 without the transmission transistor T8 (eighth transistor T8), and a case of being connected to the anode receiving the emission current by using the transmission transistor T8 (eighth transistor) and the transparent connection wire TCL2.

In FIG. 12, due to the copy anodes (Arda2-2c, Agda2-2c, and Abda2-2c), an upper-lower interval between the pixel circuit parts (Prda2-1, Prda2-2, Pgda2-1, Pgda2-2, Pbda2-1, and Pbda2-2) may be larger than that of the embodiment of FIG. 10. Although not shown in the embodiment of FIG. 12, a wire may be disposed in a portion overlapping the copy anodes (Arda2-2c, Agda2-2c, and Abda2-2c) in a plan view.

Hereinafter, a cross-sectional structure of the embodiment of FIG. 12 will be described with reference to FIG. 13.

Figure 13:
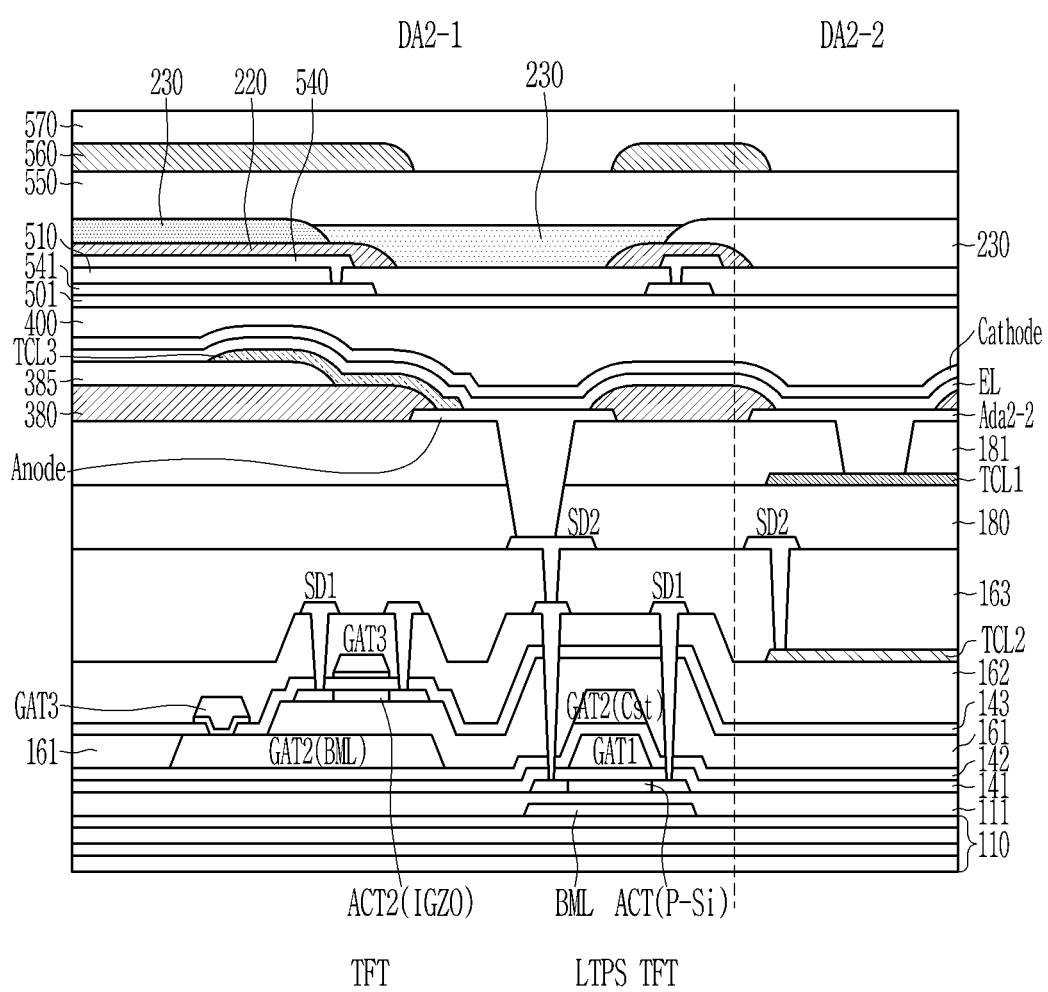
FIG. 13 illustrates a cross-sectional view of a layered structure of a first display area and a second display area in a light emitting display device according to an embodiment.

FIG. 13 illustrates a cross-sectional view of a layered structure of a first display area and a second display area in a light emitting display device according to an embodiment.

In the cross-sectional structure of FIG. 13, a structure from the metal layer BML to the pixel defining layer 380 may be substantially the same as that of FIG. 10.

Unlike FIG. 10, FIG. 13 illustrates an embodiment in which the substrate 110 is configured of a plurality of layers and may have a flexible characteristic. That is, the substrate 110 having the flexible characteristic as in the embodiment of FIG. 13 may have a structure in which a double layer of a polyimide layer and a barrier layer is repeated a plurality of times, and FIG. 13 illustrates a structure in which a polyimide layer and a barrier layer are repeatedly formed.

In addition, unlike the embodiment of FIG. 10, the embodiment of FIG. 13 has a structure in which the third gate conductive layer GAT3 is formed as a double layer.

In FIG. 13, the additionally formed copy anodes (Arda2-1c, Agda2-1c, Abda2-1c, Arda2-2c, Agda2-2c, and Abda2-2c) are made of the same material on the same layer as the other anodes (Anode and Ada2-2).

Meanwhile, the transparent connection wire TCL3 additionally formed in FIG. 13 is disposed above the other transparent connection wires TCL1 and TCL2, and is formed above the anodes (Anode and Ada2-2).

Referring to FIG. 13, a spacer 385 is disposed on the pixel defining layer 380. The spacer 385 may be an organic insulation film containing one or more of polyimide, polyamide, an acryl resin, benzocyclobutene, and a phenol resin. Meanwhile, in some embodiments, it may be made of the same material as the pixel defining layer 380 together with the pixel defining layer 380. In addition, in some embodiments, the spacer 385 may be made of a black organic material having a black color like the pixel defining layer 380.

The transparent connection wire TCL3 is disposed on the spacer 385 and the pixel definition layer 380. The transparent connection wire TCL3 may include an indium tin oxide (ITO), a poly-ITO, an indium zinc oxide (IZO), an indium gallium zinc oxide (IGZO), and an indium tin zinc oxide (ITZO).

According to the embodiment of FIG. 13, the transparent connection wire TCL3 is directly connected to the anodes (Anode and Ada2-2) exposed through the opening formed in the pixel defining layer 380.

An emission layer EL and a cathode (Cathode) may be sequentially formed on the anodes (Anode and Ada2-2), the spacer 385, the pixel definition layer 380, and the transparent connection wire TCL3. The emission layers EL and the cathode (Cathode) may be formed in the entire area, and in this embodiment, all of the emission layer EL may emit light of the same color (for example, white). Meanwhile, in some embodiments, the emission layer EL may be disposed only in the opening formed in the pixel defining layer 380 to be disposed only at an upper portion of the exposed anode (Anode and Ada2-2). In this embodiment, the emission layer EL may emit light of different colors.

The emission layer EL may include an auxiliary layer such as an electron injection layer, an electron transport layer, a hole transport layer, and a hole injection layer, and the hole injection layer and the hole transport layer may disposed at a lower portion of the emission layer EL, while the electron transport layer and the electron injection layer may be disposed at an upper portion of the emission layer EL.

The cathode (Cathode) may be formed of a light transmissive electrode or a reflection electrode. In some embodiments, the cathode may be a transparent or semi-transparent electrode, and may be formed of a metal thin film that includes lithium (Li), calcium (Ca), lithium fluoride/calcium (LiF/Ca), lithium fluoride/aluminum (LiF/Al), aluminum (Al), silver (Ag), magnesium (Mg), and a compound thereof and has a small work function. In addition, a transparent conductive oxide (TCO) such as an indium tin oxide (ITO), an indium zinc oxide (IZO), a zinc oxide (ZnO), or an indium oxide ($In_2O_3$) may be further disposed on the metal thin film. The cathode may be integrally formed in the entire display area DA, and may be disposed on the emission layer EL and the pixel defining layer 380. In addition, the cathode (Cathode) may have a translucent characteristic, and in this case, may form a micro-cavity together with the anodes (Anode and Ada2-2). According to the structure of the micro-cavity, light with a specific wavelength is emitted upward by a gap and characteristic between electrodes at both ends thereof, and as a result, red, green, or blue colors may be displayed.

An encapsulation layer 400 is disposed on the cathode (Cathode). The encapsulation layer 400 includes at least one inorganic film and at least one organic film, and in some embodiment, it may have a triple-layered structure including a first inorganic encapsulation layer, an organic encapsulation layer, and a second inorganic encapsulation layer. The encapsulation layer 400 may be for protecting the light emitting element LED from moisture or oxygen that may be introduced from the outside. In some embodiments, the encapsulation layer 400 may have a structure in which an inorganic layer and an organic layer are sequentially further stacked.

A sensing insulation layer 510, a plurality of sensing electrodes 540 and 541, and an inorganic passivation film 501 are disposed on the encapsulation layer 400 for sensing a touch. In the embodiment of FIG. 13, a touch may be sensed as a capacitive type using two sensing electrodes 540 and 541.

The inorganic passivation film 501 is formed on the encapsulation layer 400, and the plurality of sensing electrodes 540 and 541 are formed thereon. The plurality of sensing electrodes 540 and 541 may be insulated with the sensing insulation layer 510 therebetween, and a portion thereof may be electrically connected through an opening disposed in the sensing insulation layer 510. Here, the sensing electrodes 540 and 541 may include a metal such as aluminum (Al), copper (Cu), silver (Ag), gold (Au), molybdenum (Mo), titanium (Ti), or tantalum (Ta), or a metal alloy thereof, and may be formed as a single layer or multilayer.

A light blocking member 220 and a color filter layer 230 are disposed on the upper sensing electrode 541.

The light blocking member 220 may be disposed to overlap the sensing electrodes 540 and 541 in a plan view, and may be disposed so as to not overlap the anodes (Anode and Ada2-2) in a plan view. This is to prevent the anodes (Anode and Ada2-2) capable of displaying an image from being covered by the light blocking member 220 and the sensing electrodes 540 and 541.

The color filter layer 230 is disposed on the sensing insulation layer 510 and the light blocking member 220. The color filter layer 230 includes a red color filter that transmits red light, a green color filter that transmits green light, and a blue color filter that transmits blue light. Each color filter 230 may be disposed so as to overlap the anodes (Anode and Ada2-2) of the light emitting element in a plan view. Light emitted from the emission layer EL may be changed to a corresponding color to be emitted while passing through a color filter.

The light blocking member 220 may be disposed between respective color filters 230. In some embodiments, the color filter layer 230 may be replaced with a color conversion layer, or may further include a color conversion layer. The color conversion layer may include a quantum dot.

A first planarization layer 550 covering the color filter layer 230 is disposed on the color filter layer 230. A low refractive layer 560 and a second planarization layer 570 may be disposed on the first planarization layer 550 in order to improve front visibility and light emission efficiency of the display device. The low refractive layer 560 includes an opening, and is entirely covered by the second planarization layer 570. The first planarization layer 550 and the second planarization layer 570 are for planarizing an upper surface of the light emitting display device, and the first planarization layer 550 and the second planarization layer 570 may be an organic insulation film containing one or more of polyimide, polyamide, an acryl resin, benzocyclobutene, and a phenol resin. In addition, the second planarization layer 570 may include a material having a high refractive index. Meanwhile, the low refractive layer 560 may include a light transmissive organic insulation material having a low refractive index, and for example, the light transmissive organic insulation material may include at least one of an acrylic resin, a polyimide resin, a polyamide resin, and an Alq3 [Tris(8-hydroxyquinolinato)aluminum]. The low refractive layer 560 may have a relatively smaller refractive index than that of the second planarization layer 570. For example, the low refractive layer 560 may have a refractive index of about 1.40 to about 1.59, and the second planarization layer 570 may have a refractive index of about 1.60 to about 1.80. Due to the structure of the low refractive layer 560 and the second planarization layer 570, at least some of the light generated in the emission layer EL is totally reflected on an interface between the low refractive layer 560 and the second planarization layer 570, so that the light may be condensed in the front.

Figure 14:
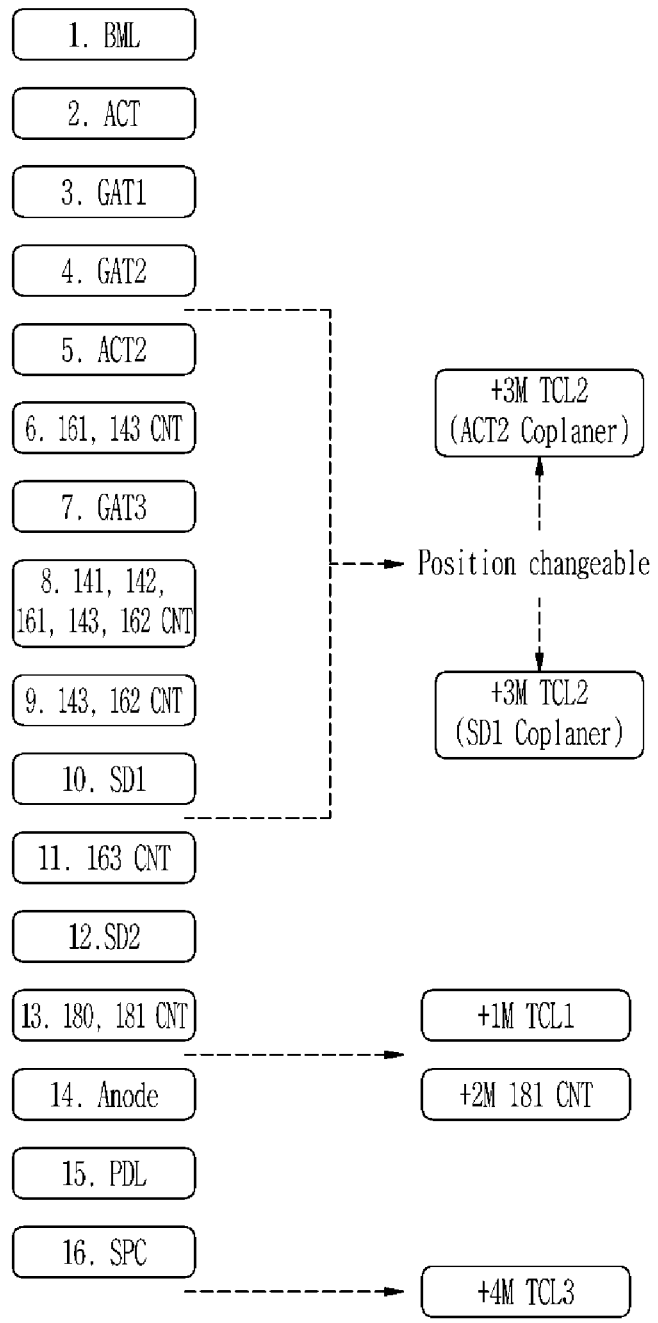
FIG. 14 illustrates a manufacturing step of a light emitting display device according to an embodiment and a variation according thereto.

The structure shown in FIG. 13 may be sequentially shown as in FIG. 14 based on a process of etching by using a mask.

FIG. 14 illustrates a manufacturing step of a light emitting display device according to an embodiment and a variation according thereto.

In FIG. 14, the order of the manufacturing process in the first display area DA1 (normal display area) is shown on the left, and the process of forming the transparent connection wires (TCL1, TCL2, and TCL3) is additionally shown on the right. The number written in each step on the left is the number of masks used when forming the first display area DA1 (normal display area), and when also forming spacers in the first display area DA1 (normal display area), they may be formed by using a total of 16 masks.

Meanwhile, in FIG. 14, although the process order of the transparent connection wires TCL1 and TCL3 is fixed, it is shown that the process order of the transparent connection wire TCL2 may be variously changed. However, in some embodiments, the process order of the transparent connection wires TCL1 and TCL3 may also be positioned in one of the process orders of the transparent connection wire TCL2.

According to FIG. 14, in the first display area DA1 (normal display area), the metal layer BML is formed on the substrate 110 by using a first mask. After the buffer layer 111 is formed on the metal layer BML, the first semiconductor layer ACT is formed thereon by using a second mask. After the first gate insulation film 141 is formed on the first semiconductor layer ACT, the first gate conductive layer GAT1 is formed by using a third mask. The second gate insulation film 142 is formed on the first gate conductive layer GAT1, and then the second gate conductive layer GAT2 is formed by using a fourth mask. After the first interlayer insulation film 161 is formed on the second gate conductive layer GAT2, the oxide semiconductor layer ACT2 is formed by using a fifth mask. After forming the third gate insulation film 143 on the oxide semiconductor layer ACT2, an opening GCNT is formed in the third gate insulation film 143 and the first interlayer insulation film 161 using a sixth mask. Next, the third gate conductive layer GAT3 is formed on the third gate insulation film 143 by using a seventh mask. The third gate conductive layer GAT3 includes a connection member connected to the lower shielding layer for the oxide semiconductor transistor through the opening GCNT formed in the third gate insulation film 143 and the first interlayer insulation film 161. After forming the second interlayer insulation film 162 on the third gate conductive layer GAT3, openings PCNT and OCNT are formed by using an eighth mask and a ninth mask. By the eighth mask, the opening PCNT may be formed in the second interlayer insulation film 162, the third gate insulation film 143, the first interlayer insulation film 161, the second gate insulation film 142, and the first gate insulation film 141 to expose the first semiconductor layer ACT, and by using the ninth mask, the opening OCNT may be formed in the second interlayer insulation film 162 and the third gate insulation film 143 to expose the oxide semiconductor layer ACT2. The first data conductive layer SD1 is formed on the second interlayer insulation film 162 by a tenth mask. The first data conductive layer SD1 may further include a portion connected to the first semiconductor layer ACT through the opening PCNT and a portion connected to the oxide semiconductor layer ACT2 through the opening OCNT. The first organic film 163 is formed on the first data conductive layer SD1, and then the opening CNT is formed in the first organic film 163 by using an eleventh mask. The second data conductive layer SD2 is formed on the first organic film 163 by using a twelfth mask. The second data conductive layer SD2 includes a portion connected to the first data conductive layer SD1 through the opening CNT formed in the first organic film 163. The second organic film 180 is formed on the second data conductive layer SD2, and then the opening CNT is formed in the second organic film 180 by using a thirteenth mask. The anode layer (Anode) is formed on the second organic film 180 by using a fourteenth mask. The anode layer (Anode) is connected to the second data conductive layer SD2 through the opening CNT in the second organic film 180. The pixel defining layer 380 is formed on the second organic film 180 by using a fifteenth mask. After that, the spacer (SPC) 385 is formed on the pixel defining layer (PDL) 380 by using a sixteenth mask. The emission layer EL and the cathode (Cathode) formed thereon may be formed in the entire area without a mask.

In the embodiment of FIG. 12 and FIG. 13, in addition to the structure of the pixel circuit part and the light emitting element of the first display area DA1 (normal display area) as described above, three additional transparent connection wires (TCL1, TCL2, and TCL3) are further formed in the second display area DA2.

In the embodiments of FIG. 12 and FIG. 13, the transparent connection wire TCL2 disposed at the lowermost may be formed on the second interlayer insulation film 162 by using a separate mask. The transparent connection wire TCL2 is made of a transparent conductive material and is disposed on the same layer as the first data conductive layer SD1 on the second interlayer insulation film 162, but is formed by using a separate mask. Referring to FIG. 14, the transparent connection wire TCL2 may be formed in one of the steps from forming the second gate conductive layer GAT2 to forming the first data conductive layer SD1.

Meanwhile, the transparent connection wire TCL1 disposed in the middle in the embodiments of FIG. 12 and FIG. 13 is formed by using a separate mask, and after forming the opening CNT by using the thirteenth mask, it is formed before forming the anode layer (Anode) by using the fourteenth mask. That is, the transparent connection wire TCL1 is formed on the second organic film 180 by using one mask, and then the third organic film 181 covering the transparent connection wire TCL1 is formed, and the opening CNT is formed in the third organic film 181 by using an additional mask. Next, the anode layer (Anode) is formed.

Meanwhile, the transparent connection wire TCL3 disposed at the uppermost position in the embodiments of FIG. 12 and FIG. 13 is formed by using a separate mask after forming the spacer (SPC) 385.

As described above, when the three transparent connection wires (TCL1, TCL2, and TCL3) are formed, a total of 4 masks may be further required. In addition, in some embodiments, the three transparent connection wires (TCL1, TCL2, and TCL3) may be disposed on different layers, unlike FIG. 14.

In some embodiments, when the transparent connection wire connecting the transmission transistor T8 (the eighth transistor) in the pixel circuit parts (Prda2-2, Pgda2-2, and Pbda2-2) for the transparent display area is referred to as a first transparent connection wire, and when the transparent connection wire directly connecting the anode and the pixel circuit parts (Prda2-2, Pgda2-2, and Pbda2-2) for the transparent display area without the transmission transistor T8 (the eighth transistor) is referred to as a second transparent connection wire, the second transparent connection wire may be formed closer to the substrate 110 than the first transparent connection wire.

In addition, when the transparent connection wire connected to the copy anodes (Arda2-1c, Agda2-1c, Abda2-1c, Arda2-2c, Agda2-2c, and Abda2-2c) is referred to as a third transparent connection wire, the third transparent connection wire may be formed farther from the substrate 110 than the first transparent connection wire and the second transparent connection wire.

In addition, referring to FIG. 14, the first transparent connection wire may be disposed during the process of manufacturing the transistor included in the pixel circuit parts (Prda2-2, Pgda2-2, and Pbda2-2) for the transparent display area, or before the next process after manufacturing the transistor.

Hereinafter, an embodiment in which more light emitting elements may be formed in the second display area DA than that of FIG. 2 will be described with reference to FIG. 15.

Figure 15:
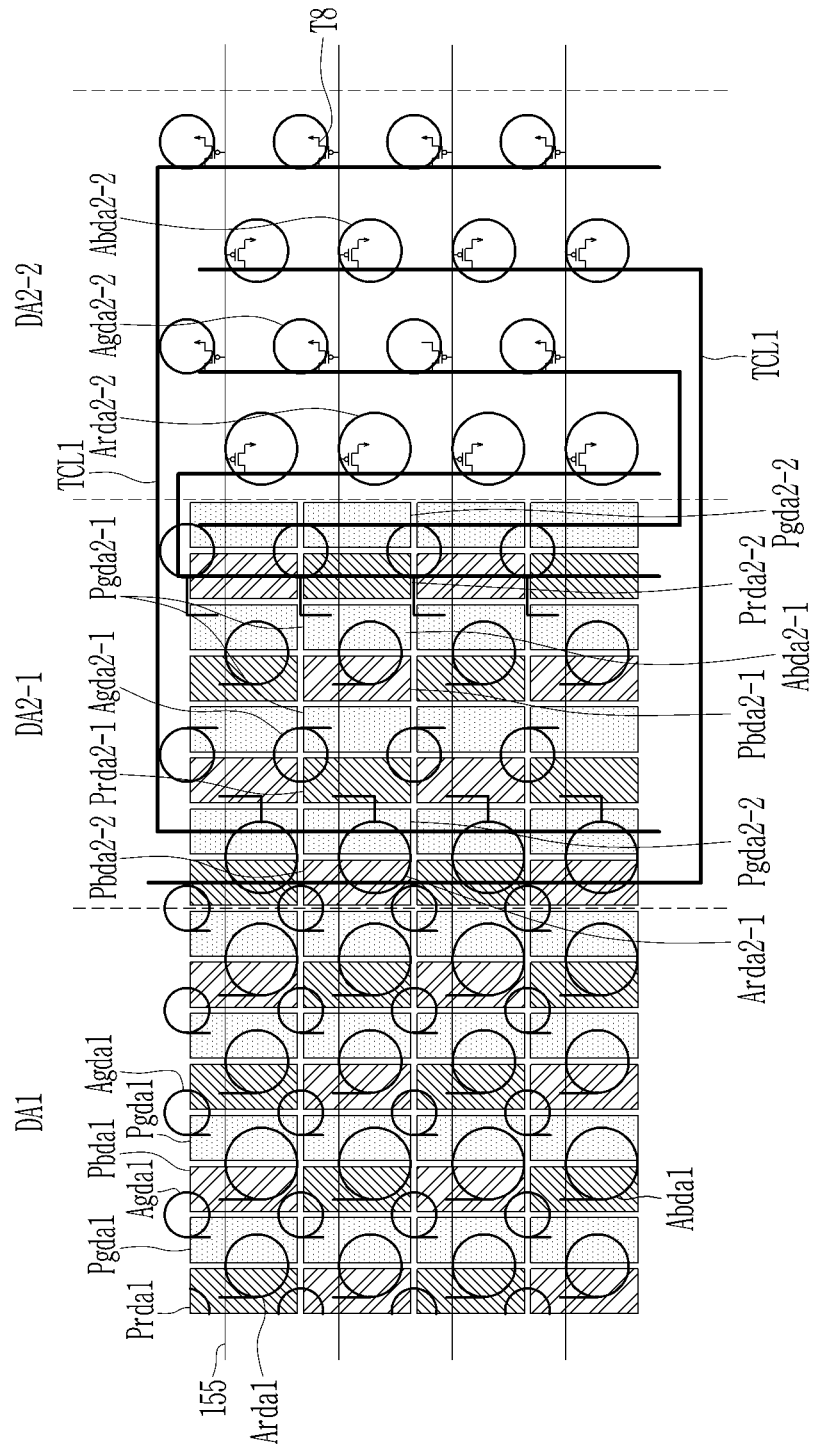
FIG. 15 illustrates an enlarged schematic view of a first display area and a second display area in a light emitting display device according to an embodiment.

FIG. 15 illustrates an enlarged schematic view of the first display area and the second display area in the light emitting display device according to the embodiment.

FIG. 15 is a variation of FIG. 2 and has the pixel circuit parts (Prda2-1, Prda2-2, Pgda2-1, Pgda2-2, Pbda2-1, and Pbda2-2), which are twice the number of the plurality of pixel circuit parts (Prda2-1, Prda2-2, Pgda2-1, Pgda2-2, Pbda2-1, and Pbda2-2) disposed in the (2-1)-th display area DA2-1 (intermediate display area) in FIG. 2. The embodiment of FIG. 15 has the pixel circuit parts (Prda2-1, Pgda2-1, and Pbda2-1) for the (2-1)-th display area and the pixel circuit parts (Prda2-2, Pgda2-2, and Pbda2-2) for the (2-2)-th display area, which are twice the number of those of the embodiment of FIG. 2.

In the embodiment of FIG. 15, the number of transmission transistors T8 (eighth transistors) and the anodes (Arda2-2, Agda2-2, and Abda2-2) connected to one transparent connection wire TCL1 may also be twice the number of those of the embodiment of FIG. 2.

A PPI (Pixel Per Inch) value of the pixel disposed in the second display area DA2 is smaller than that of the pixel formed in the first display area DA1. The PPI value of the embodiment of FIG. 15 may also be larger than that of the embodiment of FIG. 2.

TABLE 1

|  |  | First direction | Second direction | Number of pixels | PPI |
|---|---|---|---|---|---|
| First display area |  | 1 | 1 | 1 | 515 |
| (2-2)-th display area | Embodiment of FIG. 2 | ½ | ½ | ¼ | 257.5 |
|  | Embodiment of FIG. 15 | ½ | 1 | ½ | 364.2 |

As depicted in Table 1, the relationship between the light emitting element formed in the first display area DA1 and the light emitting element formed in the (2-2)-th display area DA2-2 in the embodiment of FIG. 2 and FIG. 15 is shown, the first direction and the second direction show the relationship of the number of pixels (pixel circuit parts or light emitting elements) in the corresponding direction, the number of pixels shows the relationship of the number of pixels (pixel circuit parts or light emitting elements) in a certain area, and the PPI represents the number of pixels per inch. Particularly, the first direction, the second direction, and the number of pixels represent the ratios of the number of light emitting elements formed in the (2-2)-th display area DA2-2 in the embodiments of FIG. 2 and FIG. 15 when the number of light emitting elements formed in the first display area DA1 is 1.

In the embodiment of FIG. 2, the number of light emitting elements formed in the (2-2)-th display area (DA2-2) is reduced by half in the first and second directions, respectively, so that the number of light emitting elements formed in the (2-2)-th display area DA2-2 with respect to a unit area has a value of ¼. Accordingly, the PPI value has half the PPI value of the first display area DA1.

Meanwhile, in the embodiment of FIG. 15, the number of light emitting elements formed in the (2-2)-th display area (DA2-2) is reduced by half only in the first direction, so that the number of light emitting elements formed in the (2-2)-th display area DA2-2 with respect to a unit area has a value of ½. Accordingly, the PPI value has a value between the PPI value of the first display area DA1 and the PPI value of the (2-2)-th display area DA2-2 of the embodiment of FIG. 2.

The light emitting element formed in the (2-2)-th display area DA2-2 of the present disclosure is connected to a plurality of transmission transistors T8 (eighth transistors) and anodes through one transparent connection wire TCL1, so that the number of wires connected to the anodes of the (2-2)-th display area DA2-2 may be reduced, and more anodes may be formed in the (2-2)-th display area DA2-2.

Meanwhile, since emission signals through the emission control line 155 applied to the transmission transistors T8 (eighth transistors) through one transparent connection wire TCL1 do not simultaneously turn on the transmission transistors T8 (eighth transistors) at the same time, the emission signals may not be applied while overlapping each other.

In addition, a copy anode or a copy light emitting element may be added in the embodiments of FIG. 2 and FIG. 15 as shown in FIG. 10.

Hereinafter, the structure of the display device including the display panel as described above will be described as a whole with reference to FIG. 16 and FIG. 17.

Figure 16:
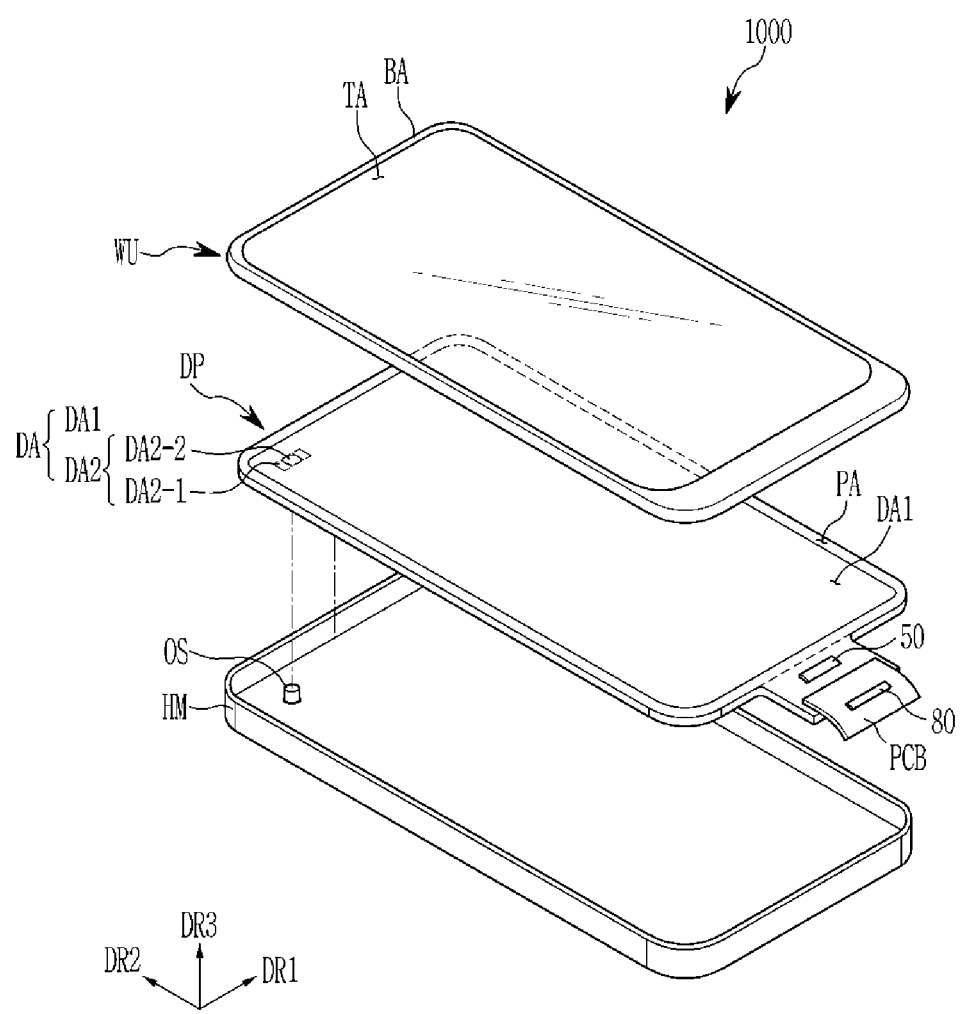
FIG. 16 illustrates an exploded perspective view of a light emitting display device according to an embodiment.
Figure 17:
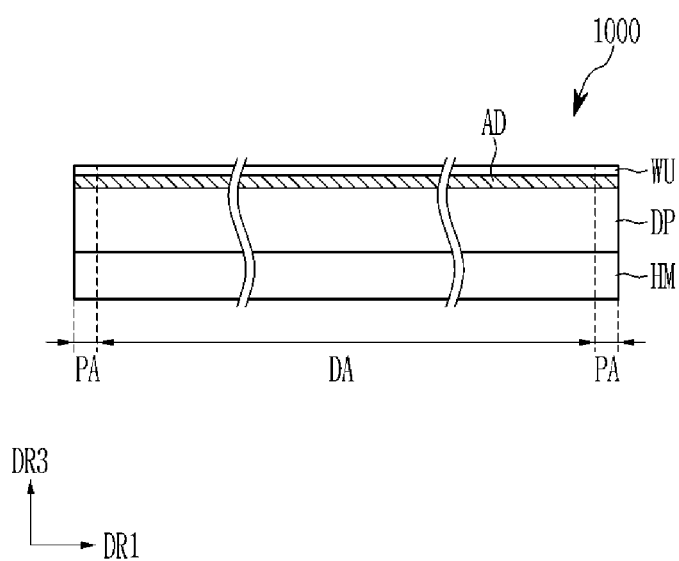
FIG. 17 illustrates a schematic cross-sectional view of a light emitting display device according to an embodiment.

FIG. 16 illustrates an exploded perspective view of a light emitting display device according to an embodiment, and FIG. 17 illustrates a schematic cross-sectional view of a light emitting display device according to an embodiment.

Referring to FIG. 16 and FIG. 17, a display device 1000 displays an image toward a third direction DR3 on a plane defined by a first direction DR1 and a second direction DR2. A front surface (or upper surface) and a back surface (or lower surface) of each member are divided by the third direction DR3. Directions indicated by the first to third direction DR1, DR2, and DR3 are relative concepts, thus they may be changed into other directions.

The display device 1000 includes a cover window WU, a display panel DP, and a housing member HM. In the present embodiment, the cover window WU, the display panel DP, and the housing member HM may be combined to form the display device 1000.

The cover window WU is disposed on the display panel DP to protect the display panel DP. The cover window WU may include a transmission area TA and a blocking area BA. The transmission area TA may be an optically transparent area, and may be an area through which incident light is transmitted. The blocking area BA may be an area having relatively low light transmittance compared with the transmission area TA. The blocking area BA defines a shape of the transmission area TA. The blocking area BA may surround the transmissive area TA. The blocking area BA may display a predetermined color. The blocking area BA overlaps a non-display area PA of the display panel DP to block the non-display area PA from being viewed from the outside.

The display panel DP may be a flat rigid display panel, but is not limited thereto, and may be a flexible display panel. The display panel according to the embodiment may be a light emitting type of display panel, but is not particularly limited thereto. For example, the display panel may be an organic light emitting display panel or a quantum dot light emitting display panel. An emission layer of the organic light emitting display panel may include an organic light emitting material. An emission layer of the quantum dot light emitting display panel may include a quantum dot and a quantum rod. Hereinafter, the display panel will be described as an organic light emitting display panel.

An image is displayed on a front surface of the display panel DP. The front surface of the display panel DP includes the display area DA and the non-display area PA. An image is displayed on the display area DA. The non-display area PA may surround the display area DA.

The display panel DP may include a plurality of pixels disposed in the display area DA. The pixels may display light in response to an electrical signal. The light displayed by the pixels may implement an image. The number of transistors and capacitors included in one pixel and their connection relationship may be variously changed.

The display panel DP according to the embodiment may include the first display area DA1 and the second display area DA2. The second display area DA2 may include the (2-1)-th display area DA2-1 and the (2-2)-th display area DA2-2 as areas that enable other functions to be performed in addition to a unique function of displaying an image. The (2-2)-th display area DA2-2 may overlap the optical device OS and has high light transmittance, and the (2-1)-th display area DA2-1 may be disposed at both sides of the (2-2)-th display area DA2-2 in the first direction DR1. Here, the light transmittance means a transmittance of light that passes through the display panel DP in the third direction DR3. The light may be visible light and/or light with a wavelength other than visible light (for example, infrared light).

In the display area DA, the second display area DA2 may be variously disposed. In the illustrated embodiment, the second display area DA2 is disposed within the first display area DA1, and is surrounded by the first display area DA1. The second display area DA2 may be disposed to contact the non-display area PA, and for example, it may be divided into two or more portions to be disposed at the left, right, and/or center in the upper end portion of the display area DA. The second display area DA2 may have various shapes such as polygons such as a quadrangle and a triangle, circles, and ellipses.

The display panel DP is extended from the display area DA to include the non-display area PA in which a plurality of signal lines and a pad part are disposed. A data driver 50 may be disposed in the non-display area PA. According to the embodiment, a pad portion of the non-display area PA may be electrically connected to a printed circuit board (PCB) including a driving chip 80.

As shown in FIG. 16, an adhesive layer AD for bonding the display panel DP and the cover window WU may be disposed between the display panel DP and the cover window WU. Meanwhile, although not shown in the present specification, a touch unit disposed between the display panel DP and the cover window WU may be further included. The touch unit may be disposed on the display panel DP for a touch screen function of the display device 1000. The touch unit may be integrally formed on the display panel DP. The touch unit may include a touch electrode of various patterns, and may be formed in a resistive film type or a capacitive type.

Referring back to FIG. 1, the optical device OS includes various functional modules for operating the display device 1000. The optical device OS may be electrically connected to the display panel DP through a connector or the like (not shown). For example, the optical device OS may be a camera or an optical sensor.

For example, the optical device OS may sense an external object received through the (2-2)-th display area DA2-2 of the display panel DP and the transmissive area TA of the cover window WU. The optical device OS may receive an external input transmitted through the (2-2)-th display area DA2-2 and the transmissive area TA, or may provide an output through the (2-2)-th display area DA2-2 and the transmissive area TA.

For example, the optical device OS may be at least one of a light emitting module, a light sensing module, and a photographing module. For example, the optical device OS may include at least one of a light emitting module for outputting infrared rays, a CMOS sensor for sensing infrared rays, and a camera module for photographing an external subject.

The housing member HM is disposed at a lower side of the display panel DP. The housing member HM is combined with the cover window WU to form an appearance of the display device 1000. The housing member HM may contain a material with relatively high rigidity. For example, the housing member HM may include a plurality of frames and/or plates made of glass, plastic, and metal.

The housing member HM provides a predetermined accommodation space. The display panel DP may be accommodated in the accommodation space to be protected from external impact.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A light emitting display device, comprising:
a display panel including a display area,
wherein the display area of the display panel includes:
a transparent display area;
an intermediate display area that is disposed at one side or both sides of the transparent display area along a first direction and includes a pixel circuit part for the transparent display area; and
a normal display area,
wherein the pixel circuit part for the transparent display area includes a driving transistor adjusting an amount of an emission current and outputting the emission current, and
wherein the transparent display area includes:
a first anode; and
a transmission transistor that transmits the emission current outputted from the driving transistor of the pixel circuit part for the transparent display area to the first anode, and
wherein the transmission transistor is disposed closer to the first anode of the transparent display area than the driving transistor of the pixel circuit part for the transparent display area disposed in the intermediate display area.

2. The light emitting display device of claim 1, wherein a wire connecting the transmission transistor to the pixel circuit part for the transparent display area is a first transparent connection wire including a transparent conductive material.

3. The light emitting display device of claim 2,
wherein the first transparent connection wire connects a plurality of the pixel circuit parts for the transparent display area and a plurality of the transmission transistors.

4. The light emitting display device of claim 3, wherein:
the first transparent connection wire includes a first portion, a second portion, and a connection portion interposed between the first portion and the second portion;
the first portion is disposed in the intermediate display area, and is connected to the plurality of the pixel circuit parts for the transparent display area; and
the second portion is disposed in the transparent display area, and is connected to a plurality of the transmission transistors.

5. The light emitting display device of claim 4, wherein:
the connection portion extends in the first direction to connect the first portion and the second portion; and
the first portion and the second portion extend in a second direction perpendicular to the first direction.

6. The light emitting display device of claim 5, wherein the first portion, the second portion, and the connection portion are integrally formed of a same transparent conductive material.

7. The light emitting display device of claim 3, wherein the intermediate display area includes:
a pixel circuit part for the intermediate display area; and
an anode receiving an emission current of the pixel circuit part for the intermediate display area and disposed in the intermediate display area.

8. The light emitting display device of claim 7, wherein the pixel circuit part for the transparent display area and the pixel circuit part for the intermediate display area have a same structure.

9. The light emitting display device of claim 7, wherein the pixel circuit part for the intermediate display area includes:
a driving transistor; and
an output control transistor receiving and outputting an emission current of the driving transistor, and
wherein a gate electrode of the output control transistor is connected to an emission control line.

10. The light emitting display device of claim 9, wherein a gate electrode of the transmission transistor is connected to the emission control line.

11. The light emitting display device of claim 7, wherein the normal display area includes:
a pixel circuit part for the normal display area; and
an anode receiving an emission current of the pixel circuit part for the normal display area and disposed in the intermediate display area.

12. The light emitting display device of claim 10, wherein the pixel circuit part for the normal display area includes:
a driving transistor; and
an output control transistor receiving and outputting an emission current of the driving transistor, and
wherein a gate electrode of the output control transistor is connected to an emission control line.

13. The light emitting display device of claim 12, wherein a gate electrode of the transmission transistor is connected to the emission control line.

14. The light emitting display device of claim 3, wherein the transparent display area further includes a second anode that receives an emission current directly from the pixel circuit part for the transparent display area without passing through the transmission transistor.

15. The light emitting display device of claim 14, wherein the second anode and the pixel circuit part for the transparent display area are connected by a second transparent connection wire including a transparent conductive material.

16. The light emitting display device of claim 15, wherein the first transparent connection wire is formed closer to a substrate than the second transparent connection wire.

17. The light emitting display device of claim 15, wherein a second display area that includes the transparent display area and the intermediate display area further includes a copy anode that is electrically connected to the first anode or the second anode.

18. The light emitting display device of claim 17, wherein the first anode or the second anode and the copy anode are connected by a third transparent connection wire including a transparent conductive material, and
the third transparent connection wire is formed further away from a substrate than the first transparent connection wire and the second transparent connection wire.

19. The light emitting display device of claim 2, wherein the first transparent connection wire is formed during a process of manufacturing a transistor included in the pixel circuit part for the transparent display area or formed after manufacturing the transistor.

20. The light emitting display device of claim 1, further comprising
an optical element disposed on a back surface of the display panel,
wherein the transparent display area overlaps the optical element in a plan view.

* * * * *